(12) United States Patent
Hebert

(10) Patent No.: US 8,168,490 B2
(45) Date of Patent: May 1, 2012

(54) CO-PACKAGING APPROACH FOR POWER CONVERTERS BASED ON PLANAR DEVICES, STRUCTURE AND METHOD

(75) Inventor: Francois Hebert, San Mateo (CA)

(73) Assignee: Intersil Americas, Inc., Milpitas, CA (US)

( * ) Notice: Subject to any disclaimer, the term of this patent is extended or adjusted under 35 U.S.C. 154(b) by 0 days.

(21) Appl. No.: 12/470,229

(22) Filed: May 21, 2009

(65) Prior Publication Data

US 2010/0155836 A1  Jun. 24, 2010

Related U.S. Application Data

(60) Provisional application No. 61/140,610, filed on Dec. 23, 2008, provisional application No. 61/162,232, filed on Mar. 20, 2009.

(51) Int. Cl.
*H01L 21/8238* (2006.01)
(52) U.S. Cl. ......... 438/199; 438/197; 438/107; 257/334
(58) Field of Classification Search ................... 438/199, 438/197; 257/334
See application file for complete search history.

(56) References Cited

U.S. PATENT DOCUMENTS

| | | | | |
|---|---|---|---|---|
| 4,924,112 A | * | 5/1990 | Anderson et al. | 326/32 |
| 5,119,159 A | * | 6/1992 | Hoshi | 257/328 |
| 5,242,841 A | * | 9/1993 | Smayling et al. | 438/275 |
| 6,700,793 B2 | * | 3/2004 | Takagawa et al. | 361/777 |
| 6,710,439 B2 | * | 3/2004 | Lee et al. | 257/691 |
| 6,812,782 B2 | | 11/2004 | Grant | |
| 7,271,470 B1 | | 9/2007 | Otremba | |
| 7,459,750 B2 | | 12/2008 | Ludikhuize | |
| 7,618,896 B2 | | 11/2009 | Joshi et al. | |
| 2003/0098468 A1 | | 5/2003 | Wheeler et al. | |
| 2005/0179472 A1 | | 8/2005 | Nakamura et al. | |
| 2005/0245020 A1 | * | 11/2005 | Zhu et al. | 438/213 |
| 2005/0280163 A1 | | 12/2005 | Schaffer et al. | |
| 2006/0231904 A1 | * | 10/2006 | Kocon | 257/391 |
| 2007/0158778 A1 | | 7/2007 | Kitabatake et al. | |
| 2007/0249092 A1 | | 10/2007 | Joshi et al. | |
| 2008/0023785 A1 | | 1/2008 | Hebert | |
| 2008/0023825 A1 | | 1/2008 | Hebert et al. | |
| 2008/0024102 A1 | | 1/2008 | Hebert et al. | |
| 2009/0039394 A1 | | 2/2009 | Uno et al. | |
| 2009/0057869 A1 | | 3/2009 | Hebert et al. | |
| 2009/0072368 A1 | | 3/2009 | Hu et al. | |
| 2009/0263947 A1 | | 10/2009 | Hebert | |
| 2010/0133644 A1 | | 6/2010 | Hebert | |
| 2010/0140693 A1 | | 6/2010 | Hebert | |
| 2010/0155837 A1 | | 6/2010 | Hebert | |
| 2010/0155915 A1 | | 6/2010 | Bell et al. | |

FOREIGN PATENT DOCUMENTS

| | | |
|---|---|---|
| KR | 20050085461 | 8/2005 |
| WO | 2004054078 | 6/2004 |

* cited by examiner

*Primary Examiner* — Bradley K Smith
*Assistant Examiner* — Mohammad T Karimy
(74) *Attorney, Agent, or Firm* — Fogg & Powers LLC

(57) ABSTRACT

A voltage converter includes an output circuit having a high-side device and a low-side device which can be formed on a single die (a "PowerDie"). The high-side device can include a lateral diffused metal oxide semiconductor (LDMOS) while the low-side device can include a planar vertical diffused metal oxide semiconductor (VDMOS). The voltage converter can further include a controller circuit on a different die which can be electrically coupled to, and co-packaged with, the power die.

7 Claims, 27 Drawing Sheets

CO-PACKAGING APPROACH FOR POWER CONVERTERS BASED ON PLANAR DEVICES, STRUCTURE AND METHOD

CROSS-REFERENCE TO RELATED APPLICATION

This application claims priority to provisional U.S. Patent Application Ser. No. 61/140,610 filed Dec. 23, 2008, and to provisional U.S. Patent Application Ser. No. 61/162,232 filed Mar. 20, 2009, the disclosures of which are herein incorporated by reference in their entirety.

FIELD OF THE INVENTION

This invention relates to the field of semiconductor devices, and more particularly to power conversion and control structures and their methods of formation.

BACKGROUND OF THE INVENTION

Semiconductor devices which provide power converter functionality, for example for altering DC power using a DC to DC (DC-DC) converter, are used in various capacities. For example, input DC power from one or more batteries can be converted to provide one or more power outputs at voltages which can be higher or lower than the input DC voltage. Performing a power conversion function using integrated circuits (IC's) typically requires a control circuit, a DC high-side device electrically coupled with voltage in ($V_{IN}$), and a DC low-side device electrically coupled with ground. In a synchronous step-down device (i.e. a "synch buck" converter), for example, power conversion is performed to decrease voltage by alternately enabling the high-side device and the low-side device, with a switching and control function being performed by the controller circuit with high efficiency and low power loss through the device.

Power converter circuits which can operate at a high power density (for example, high voltage and high current) are needed, particularly devices which can efficiently convert high density power at a reasonable cost. One challenge with high power density is that the size of the output circuitry increases as the voltage and current rating of the converter increases. Different implementations of the controller circuit, the high-side device, and the low-side device have been used, each with its own advantages and disadvantages.

Monolithic devices could be formed which contain the controller circuit, the high-side device, and the low-side device on a single piece of silicon. In high density devices, the percent of silicon containing the controller circuitry is much smaller than the percent of silicon containing the high current output devices. The output power devices can require more than 50% of the die surface. However, forming the controller circuitry can require providing CMOS devices, bipolar devices, LDMOS devices, nonvolatile memory, diodes, resistors, capacitors, etc., and can involve the use of more than 20 mask steps during the fabrication process. In contrast, forming the output power devices can require eight or fewer mask steps for their fabrication. Because of mask misalignment and other processing issues, processing failures increase with increasing mask steps. Thus forming the controller circuitry and output devices on the same piece of silicon is inefficient and costly, because silicon formed with an eight mask process is subject to a 20 mask process failure rate and extra cost (equivalent to 12 extra mask layers). As such, monolithic devices are not used to integrate the power devices with the controller circuitry.

Co-packaged devices can include controller circuitry on one semiconductor die, the high-side device on a second die, and the low-side device on a third die. In one type of co-packaged device, the controller circuitry on one die is then connected to the high-side and low-side devices formed from standard vertical MOSFETs on the other two dies using bond wires or other connections. In another type of device, the controller circuitry on one die is the connected to the high-side device including bottom-source lateral diffusion metal oxide semiconductor (LDMOS) and a low-side vertical diffusion MOS (DMOS) device. In both of these devices, the three separate dies are then encapsulated or otherwise packaged together in one IC device. Forming controller, low-side, and high-side devices on separate dies overcomes the above-stated problems of monolithic devices. However, co-packaged devices can have problems with interconnection parasitics on the controller IC which can negatively influence device performance. This may result from parasitic inductance inherent in bond wires, electromagnetic interference (EMI), ringing, efficiency loss, etc. Higher-quality connections such as copper plate (or clip) bonding, or ribbon bonding, can be used to reduce parasitics, but this increases assembly costs. Further, co-packaging standard vertical MOSFETs can result in a circuit with parasitic inductance in series with the output node. Problems caused by parasitic inductances are well established in the art. While a capacitor can be connected to the output terminals such as the input ($V_{IN}$) and ground, to compensate for the negative impact of inductances connected to these nodes, capacitances cannot be connected to internal nodes such as the Output ($V_{OUT}$, also referred to as phase node or switched node).

Additionally, packages containing three separate dies have higher production costs, for example because of the large number of die attach steps (three in this example), and additional space is required for spacing between adjacent dies to allow for die attach fillets, die placement tolerance, and die rotation tolerance, which reduces the power-density which can be achieved. Examples of co-packaged devices include non-synch buck with co-packaged high-side MOSFET and external Schottky diode, non-synch buck with co-packaged high-side and low-side MOSFETs, synchronous buck with co-packaged high-side and low-side MOSFETs, boost converter with co-packaged MOSFET, and boost converter with co-packaged MOSFET and Schottky diodes.

Discrete devices can also be mounted separately to a printed circuit board. In this solution, a first packaged die containing controller circuitry is used in conjunction with a second packaged die containing a high-side MOSFET and a third package containing a low-side MOSFET. The three packages are mounted on a printed circuit board. However, this can increase packaging costs as the number of dies and separate packages which must be manufactured and handled is at least tripled, and the area used on the printed circuit board is also increased, leading to increased circuit board size.

There is a need for power converters in which device processing costs are reduced while providing a power converter device which has sufficient device electrical characteristics with low parasitic inductance and capacitance.

BRIEF DESCRIPTION OF THE DRAWINGS

The accompanying drawings, which are incorporated in and constitute a part of this specification, illustrate embodiments of the invention and together with the description, serve to explain the principles of the invention. In the figures.

It should be noted that some details of the FIGS. have been simplified and are drawn to facilitate understanding of the inventive embodiments rather than to maintain strict structural accuracy, detail, and scale.

DESCRIPTION OF THE EMBODIMENTS

Reference will now be made in detail to the present embodiments (exemplary embodiments) of the invention, examples of which are illustrated in the accompanying drawings. Wherever possible, the same reference numbers will be used throughout the drawings to refer to the same or like parts.

There is a need for an improved output stage which features a low implementation cost (low die cost), low parasitic inductance and capacitance, minimized die size, and low assembly (packaging) cost. Preferably, optimization of the output stage based on circuit requirements should be possible. To further improve power device converter performance, it is desirable to integrate a Schottky diode within a low-side power MOSFET to bypass its parasitic body diode. This can reduce the power loss when reverse current flows through the body diode of the low-side MOSFET (since Schottky diodes have a much lower forward voltage drop than standard silicon diodes, at the same current density), and may reduce ringing due to the reduced stored charge of Schottky diodes compared to standard silicon diodes. Therefore, efficient integration of a high-performance Schottky diode is desired for high-efficiency applications.

In an embodiment of the device, the high-side and low-side devices can be combined monolithically on one substrate (a first die, a "PowerDie"), with one substrate (a second die) for the control circuitry. The high-side device can be formed using a high performance lateral N-channel diffusion metal oxide semiconductor (LDMOS) field effect transistor (FET), and the low-side device can be formed from a planar N-channel vertical diffusion metal oxide semiconductor (DMOS) FET. The output devices can include similar threshold voltages. Various embodiments will be described which include the use of field oxide, and other embodiments which do not include the use of field oxide.

Thus in an embodiment, the entire output stage can be integrated on one die. An embodiment can be fabricated using an efficient process flow which minimizes the number of processing steps to form a circuit which can minimize or eliminate parasitic inductance. Further, the device is compatible with device structures which feature high-frequency of operation and minimized parasitic capacitances and inductances, operates at a high power density, and achieves a low assembly cost by minimizing the number of components. Additional embodiments can include an integrated Schottky diode formed during the process flow of the method embodiments.

Figure 1:
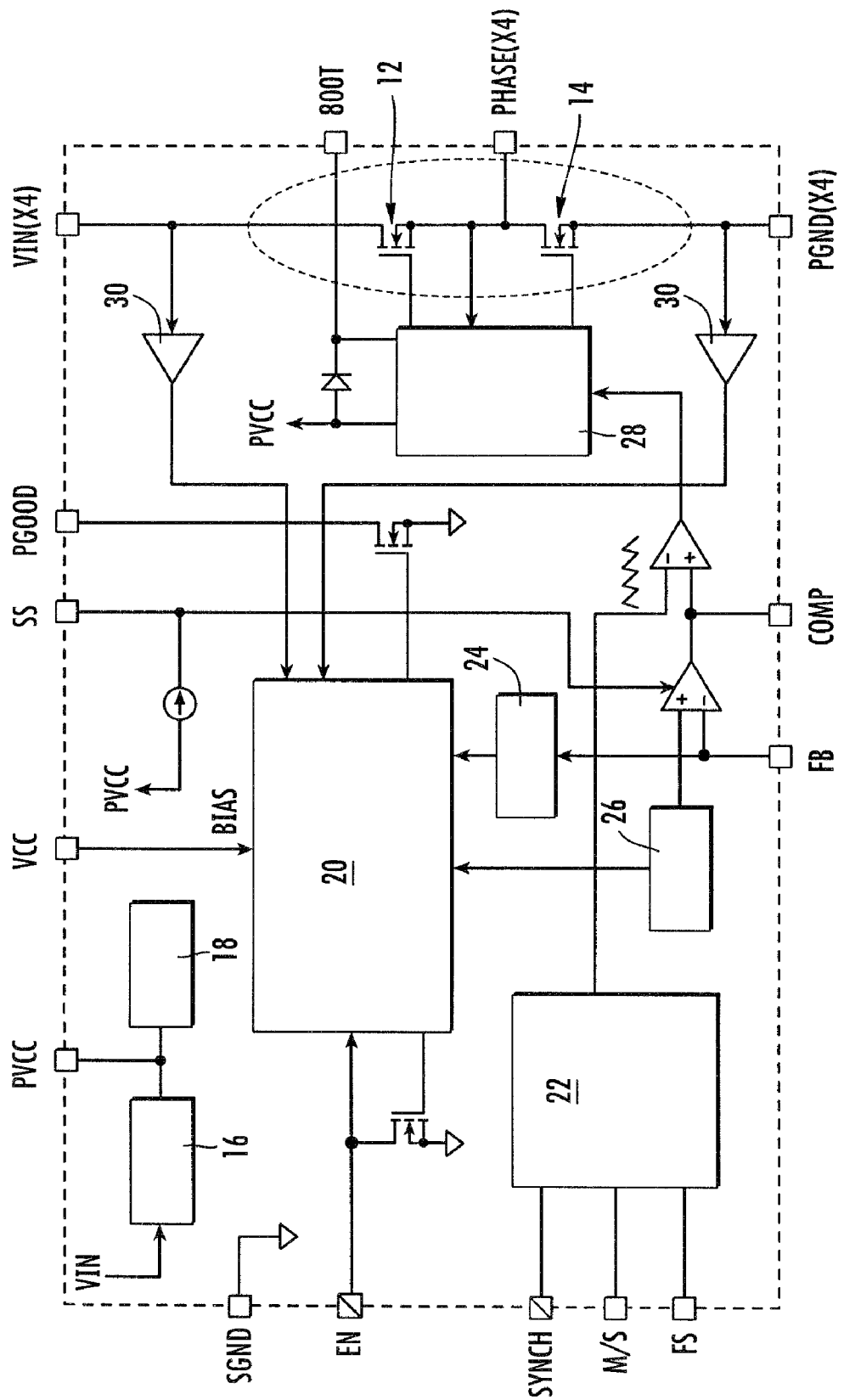
FIG. 1 is an electrical schematic including a voltage converter device.

FIG. 1 depicts a circuit block diagram of a circuit 10 including a power converter. Depicted are output devices including a high-side device 12 and a low side device 14. This device schematic depicts a pair of N-channel MOSFET enhancement mode devices for use as the output devices. In an embodiment of the inventive device, an LDMOS MOSFET is used as the high-side device and a planar vertical DMOS MOSFET as the low-side device in a voltage converter circuit.

In addition to the signals and connections depicted, the voltage converter of FIG. 1 can include the following: series regulator 16; POR monitor 18; fault monitoring 20; clock and oscillator generator 22; voltage monitor 24; 0.6V reference 26; gate drive and adaptive shoot thru protection 28; OC monitors 30.

Figure 2:
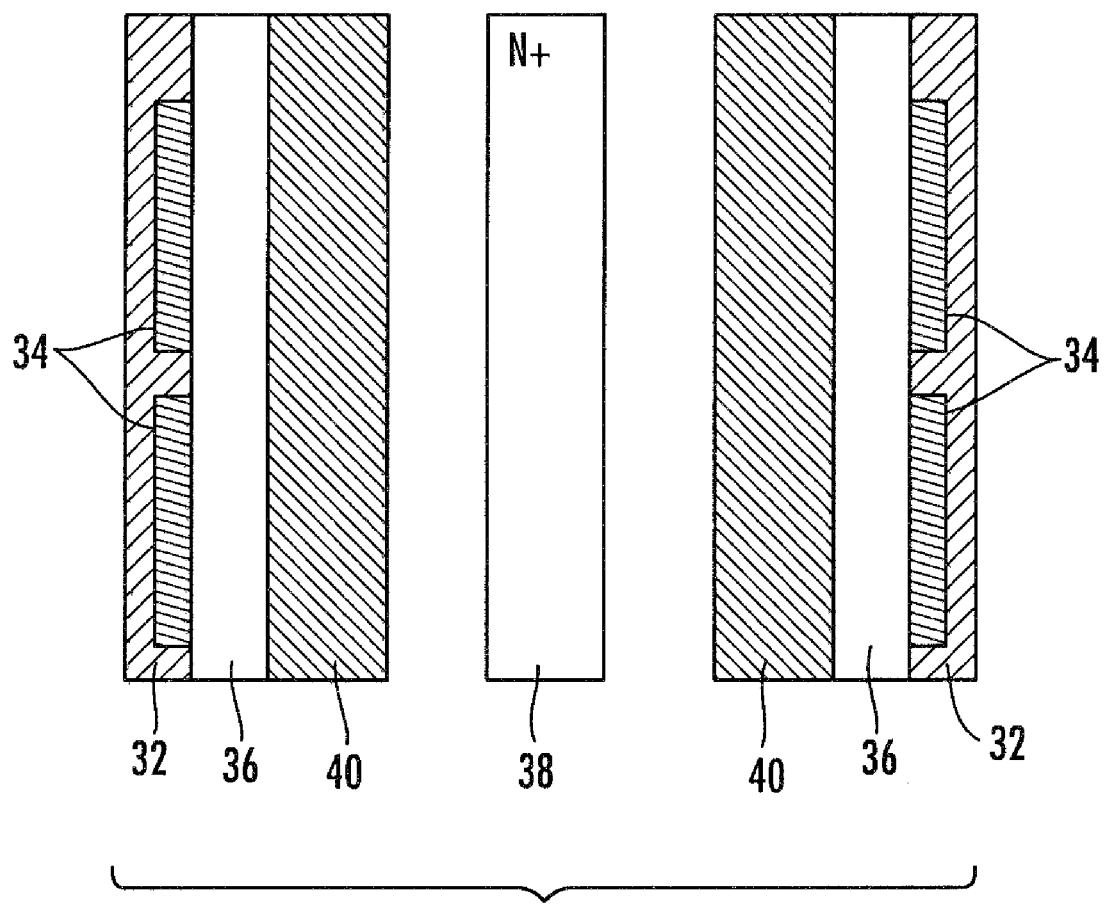
FIG. 2 is a plan view of a trench-substrate-contact (TSC) structure including an "interrupted finger" configuration.

To help provide a low resistance contact to the body of the high side LDMOS device, a trench-substrate-contact (TSC) structure can be formed as an "interrupted finger" as depicted in the plan view of FIG. 2. This structure can provide a direct contact to the body region near and under the active source at the ends of the interrupted TSC finger. FIG. 2 depicts the following: P+ body contact implant regions 32; interrupted trench-substrate contacts 34; N+ source regions 36; N+ drain region 38; transistor gates 40.

In the description of the embodiments below, it will be understood by those of ordinary skill in the art that the description is exemplary. Variations to the processes and resulting structures of the various embodiments, for example to the materials, thicknesses and widths, doping concentrations, etc., will be apparent. Also, some additional processing steps and material/doping layers can be included in the described processes, while other described structures and process steps may be optional and not required to form a functional device. Further, the drawings depict power devices with "striped" gate fingers, which are parallel. Variations of the geometries are possible, such as "closed cell" geometries which are well known by those of ordinary skill in the art of power devices. A closed cell geometry refers to structures with gate fingers which surround the source and body contact. The cells can be square, rectangular, hexagonal, etc.

Exemplary Embodiment 1

Figure 3:
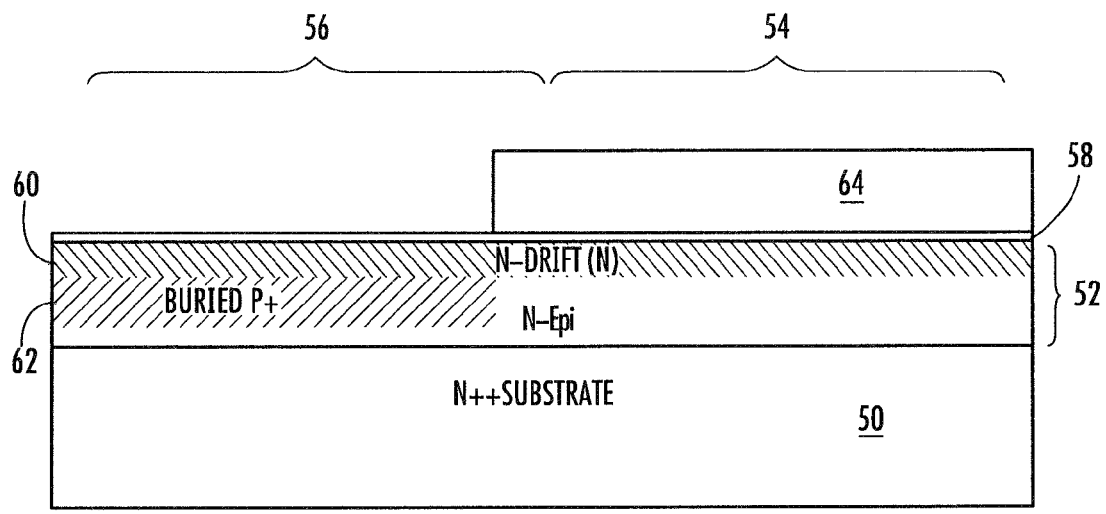
FIGS. 3-10 are cross sections depicting a first embodiment of a method and intervening structures of a voltage converter output structure.

A first embodiment is depicted in the cross sections of FIGS. 3-10. FIG. 3 depicts a structure including a semiconductor substrate 50, for example silicon, gallium arsenide, silicon carbide, gallium nitride, etc., heavily doped to an N-type conductivity (N+++), for example with arsenic to a concentration of about 1E18 to 1E20 atoms/cm$^3$. The semiconductor substrate 50 is (or will subsequently be) configured such that the depicted region will provide its output to the power converter inductor to provide a device switched node. An N-type epitaxial (epi) layer 52 is formed according to techniques known in the art on the silicon substrate to a thickness which is a function of the desired breakdown voltage of the vertical low-side device to be formed in region 54, with the high-side device formed at region 56. For a 30V breakdown voltage for example, the thickness may be in the range of about 2.5 microns to about 5 microns thick, with a doping concentration in the range of between about 2E16 atoms/cm$^3$ to about 3E16 atoms/cm$^3$. For lower-operating voltages, the epitaxial layer thickness would be reduced (as thin as 0.5 micron for example), and the epitaxial doping concentration would be increased (up to 5E16 for example). For higher operating voltages, the epi thickness would be increased and the doping concentration would be reduced. A pad dielectric (pad oxide) 58 to reduce stress, protect the silicon surface, and screen contaminants from any subsequent ion implantation step can be formed to a thickness of between about 150 angstroms (Å) to about 400 Å on the epi layer. Next, a blanket drift implant 60 can be performed to provide an N-type drift layer using a dose of phosphorous in the range of about 5E11 to about 4E13 atoms/cm$^2$ at an implant energy of between about 40 KeV to about 360 KeV.

Subsequently, a deep P+ boron implant can be performed to provide a high-side P+ buried layer 62. As depicted, an optional mask 64 can be formed to prevent the deep P+ boron implant into the low-side device 54, although in some instances the implant in the low-side device may be desired. The buried layer implant can be performed at an energy of between about 200 KeV to about 2,000 KeV, for example between about 500 KeV and about 1500 KeV at a dose of between about 1E12 to about 1E15 atoms/cm$^2$. It should be noted that the N-type drift implant 60 can be formed using this same buried layer implant mask, if it is desired to eliminate this implant from the vertical DMOS step. The implanted boron can be diffused to a sufficient depth by performing a sinker anneal at a temperature of between about 1,050° C. and about 1,200° C. for between about 20 minutes to about 5 hours using an oxygen bleed during the beginning of this anneal, followed by a nitrogen ambient to result in a structure similar to FIG. 3.

Figure 4:
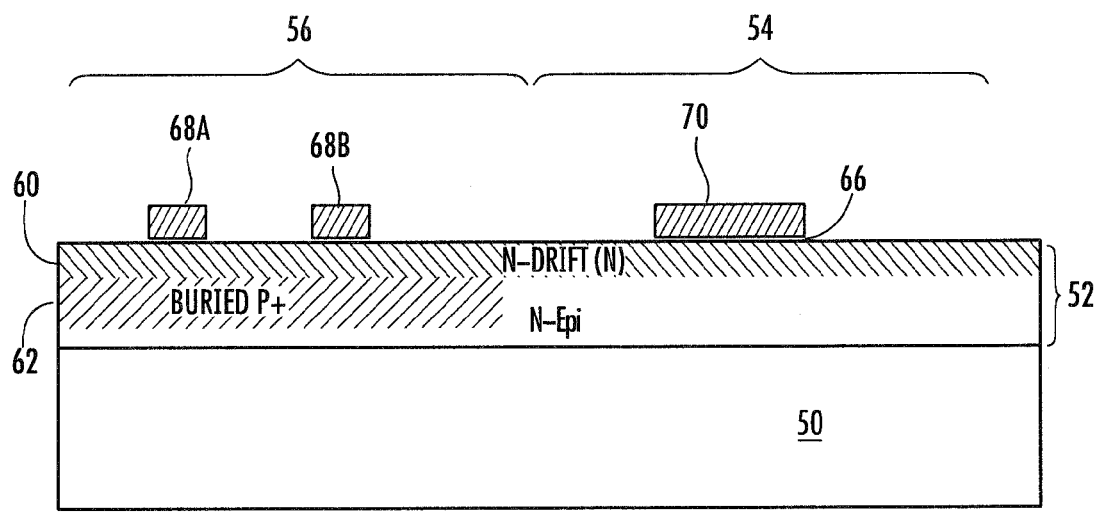

Next, as depicted in FIG. 4, the pad oxide is stripped and a gate dielectric (gate oxide) 66 is provided at a thickness of between about 100 Å to about 1,000 Å. A thickness of about 250 Å would be sufficient for a device receiving a 12V DC supply, about 450 Å for a device receiving a 20V DC supply, etc. One or more blanket gate conductor layers, for example including one or more of metal, polysilicon, silicide, etc., are formed. For a polysilicon gate, the gate layer can formed to a thickness of between about 1,000 Å to about 5,000 Å, and doped or implanted with an N-type dopant such as arsenic, phosphorous, or POCl$_3$. An optional silicide can be formed on the gate conductor using known techniques, for example to form a tungsten silicide layer between about 500 Å to about 3,000 Å to complete the gate conductor layer. The gate conductor layer is then masked and etched to expose the gate oxide to provide the three gates as depicted in FIG. 4, two cross-sectional portions 68A, 68B for the high-side device (which form one continuous gate in three dimensions) and one 70 for the low-side device. The single gate finger of the low-side device depicted can be connected to other fingers (not depicted) of the low-side device.

Subsequently, a patterned shallow body mask is formed and a P-type (boron) implant is performed and annealed to provide patterned body diffusion regions 72A-72D. The shallow body mask is then removed to result in a structure similar to FIG. 5. An implant of boron to a dose of between about 5E12 atoms/cm$^2$ and about 5E14 atoms/cm$^2$ at an energy of between about 20 KeV to about 80 KeV using no tilt would be sufficient. To diffuse the boron under the gates, an anneal at a temperature of between about 1,000° C. and about 1,150° C. for a duration of between about 20 minutes to 2 hours in a nitrogen ambient would provide a sufficient body diffusion. Advantageously, the same body diffusion region for both the high-side LDMOS 56 and the low-side planer VDMOS 54 can be used because the same gate oxide, same background doping, and same planar type structure (DMOS) is used for both devices. This can eliminate the need for a separate mask step to form each device and decrease other associated processing requirements, thereby reducing costs over conventional processes.

Figure 5:
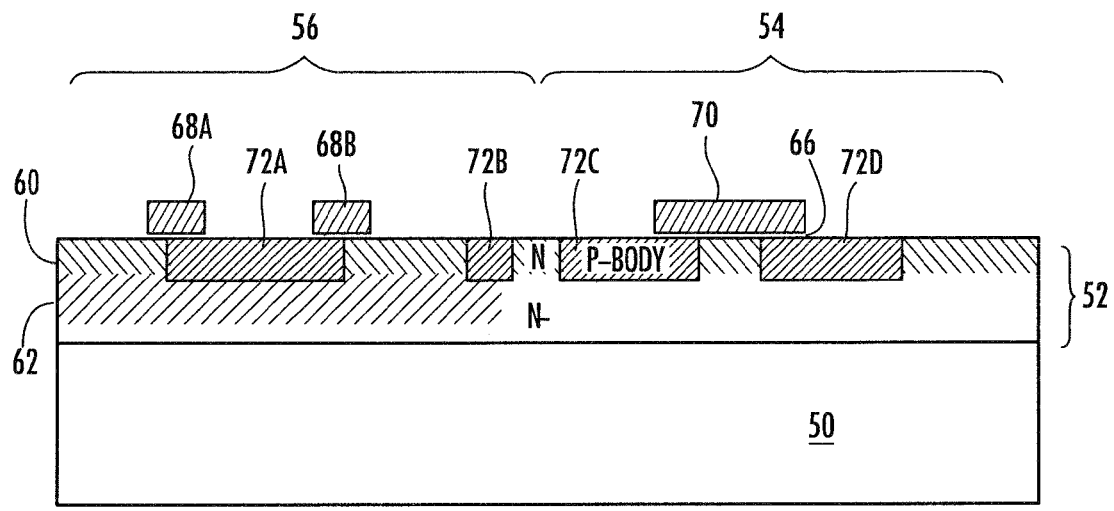
Figure 6:
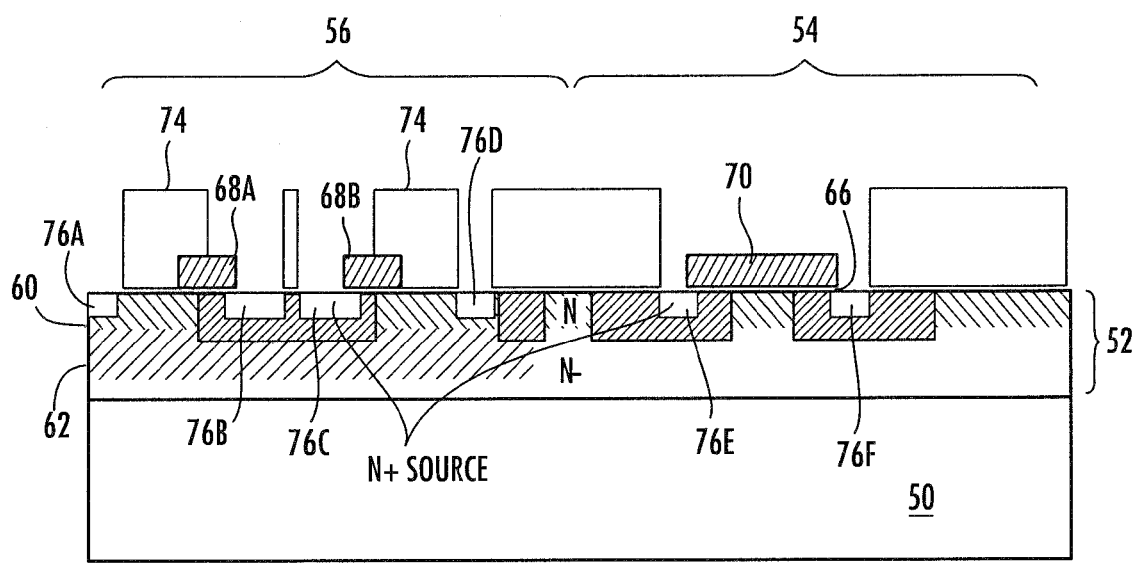

After forming the FIG. 5 structure, a source mask 74 is formed as depicted in FIG. 6, and an N+ source/drain implant can be performed to form regions 76A-76F. An arsenic implant at an energy of between about 50 KeV to about 100 KeV and a dose of between about 1E15 atoms/cm$^2$ to about 1E16 atoms/cm$^2$ with zero tilt can be performed. A diffusion anneal at a temperature of between about 850° C. to about 1,000° C. for a duration of between about 30 minutes to about 60 minutes in an O$_2$ gas flow would be sufficient to provide the source/drain regions 76A-76F as depicted in FIG. 6.

Figure 7:
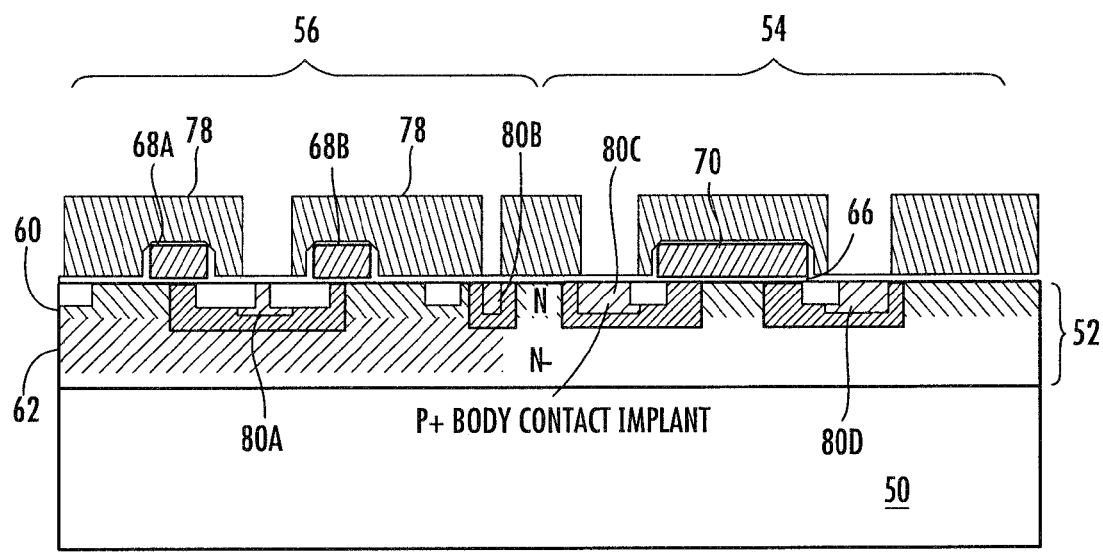

Next, a patterned body contact mask 78 can be formed as depicted in FIG. 7, followed by a P+ body contact implant to form regions 80A-80D. The body contact implant can include an implant of boron difluoride (BF$_2$) to a dose of between about 1E15 atoms/cm$^2$ to about 5E15 atoms/cm$^2$ at an energy of between about 20 KeV to about 100 KeV. The initial body contact implant can be followed by an optional deeper implant of boron-11 (B11) to a dose of between 5E14 atoms/cm$^2$ to about 5E15 atoms/cm$^2$ at an energy of between about 30 and 180 KeV, which can further increase the amount of boron under the source region near the gate, to reduce any parasitic bipolar effect and to increase the robustness of the device. Next, the mask is stripped and a body contact implant anneal can be performed at between about 850° C. to about 1,100° C. in an N$_2$ ambient, for example using rapid thermal processing (RTP) for a few seconds to a few minutes, or a furnace anneal of 10 to 60 minutes.

Subsequently, a blanket dielectric deposition is performed to result in a dielectric layer 82, for example a conformal silicon dioxide layer, between about 200 Å to about 3,000 Å thick. A patterned substrate contact mask can be formed which protects various device regions while exposing a location 84 between the two high-side gates 68A, 68B. A vertical, anisotropic etch is performed to remove exposed portions of the blanket dielectric layer 82, the P+ body contact 80A, the P-type body diffusion region 72A, the buried P+ region 62 in the epitaxial layer 52, and a portion of the heavily doped N+++ substrate 50. This etch defines the interrupted trench-substrate-contact (TSC) structure 34 depicted in FIG. 2. The depth of the etch will depend on the thickness of the various layers, however the etch should expose a portion of the semiconductor substrate 50 to allow for electrical contact therewith. An exemplary depth will be about equal to the thickness of the epitaxial layer, plus about 5,000 Å. The width of the trench can be of the order of 0.3 to 1.5 micron (0.6 to 0.9 preferred) and the depth should be equivalent to the thickness of the epitaxial layer (or ~3-5 micron for a 30V device). The etch can be performed using a reactive ion etcher (RIE) which can etch silicon selectively to oxide and photoresist. After the etch, an optional N+ trench bottom implant can be performed to enhance electrical contact with a subsequently formed conductive layer within the trench, and an optional oxide wet etch can also be performed to pull back the dielectric layer prior to deposition of the conductive layer. If an etch of the dielectric layer is performed, the etch is terminated before removing the entire thickness of the layer, such that between about 200 Å and about 1,000 Å remains.

Figure 8:
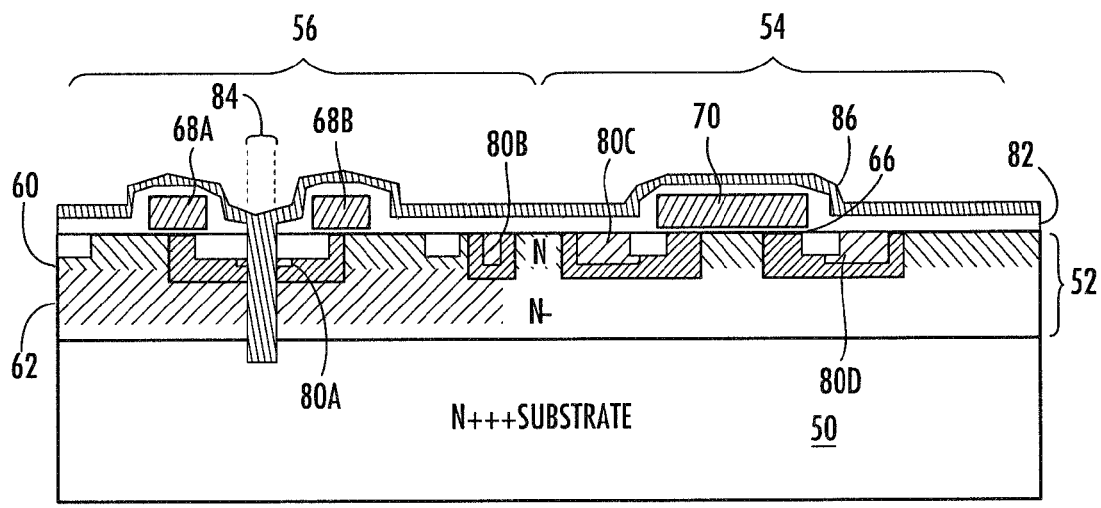

After preparing the trench opening and performing optional or other processing, one or more conductive layers 86 are formed within the trench opening and over exposed surfaces to result in a structure similar to FIG. 8. A layer of tungsten (W) and/or tungsten silicide (WSi$_x$) can be deposited or otherwise formed. Another material such as titanium nitride (TiN) can also be used, particularly if subsequent processing steps are performed at temperatures below about 900° C. Cobalt silicide may also function sufficiently. To ensure complete filling of the trench opening, the thickness of the conductive layer should be at least half as thick as the width of the trench opening. The conductive layer should provide a low resistance ohmic contact to both N-type (trench bottom implant, substrate, N-epi, N+ source) and P-type (P+ body contact, P-Body) regions. Doped semiconductors such as polysilicon, could not provide such a function.

Figure 9:
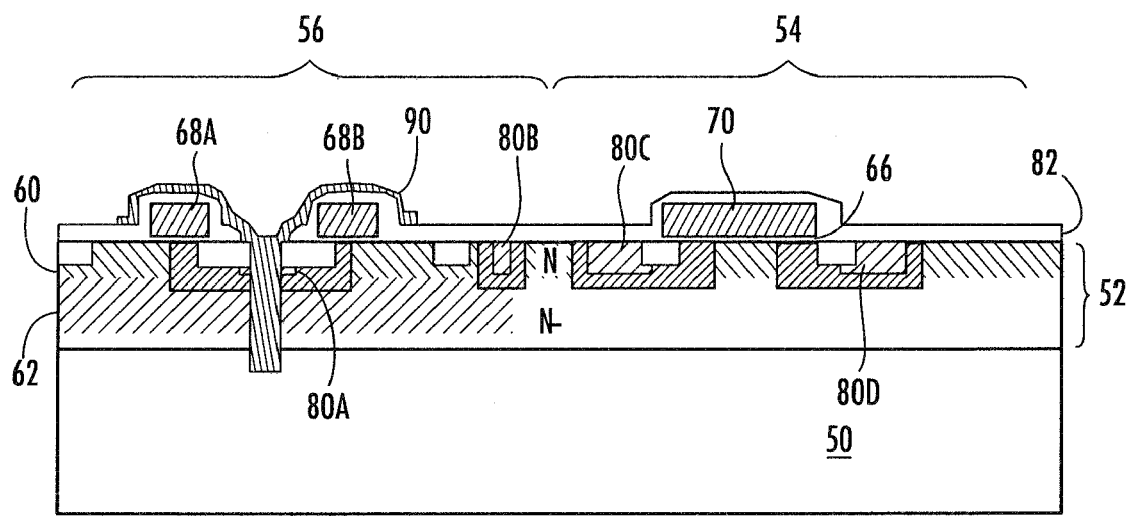

Next, the conductive layer can be patterned, for example using a patterned gate shield mask of photoresist, then etched using an etch appropriate for the material of the conductive layer, stopping on the underlying dielectric layer to form the patterned conductive layer 90 of FIG. 9. Patterning of this layer can include the formation of a high-side gate shield, which is a conductor connected to the source of the high-side device, and overlaps the gate to shield it from its drain electrode. This reduced gate to drain capacitance and improves the reliability of the device. The mask is removed to result in a structure similar to that depicted in FIG. 9. An anneal between about 800° C. to about 1,000° C. can be performed, depending on the conductive material used, for between about 30 seconds and about 60 seconds in a nitrogen ambient.

Figure 10:
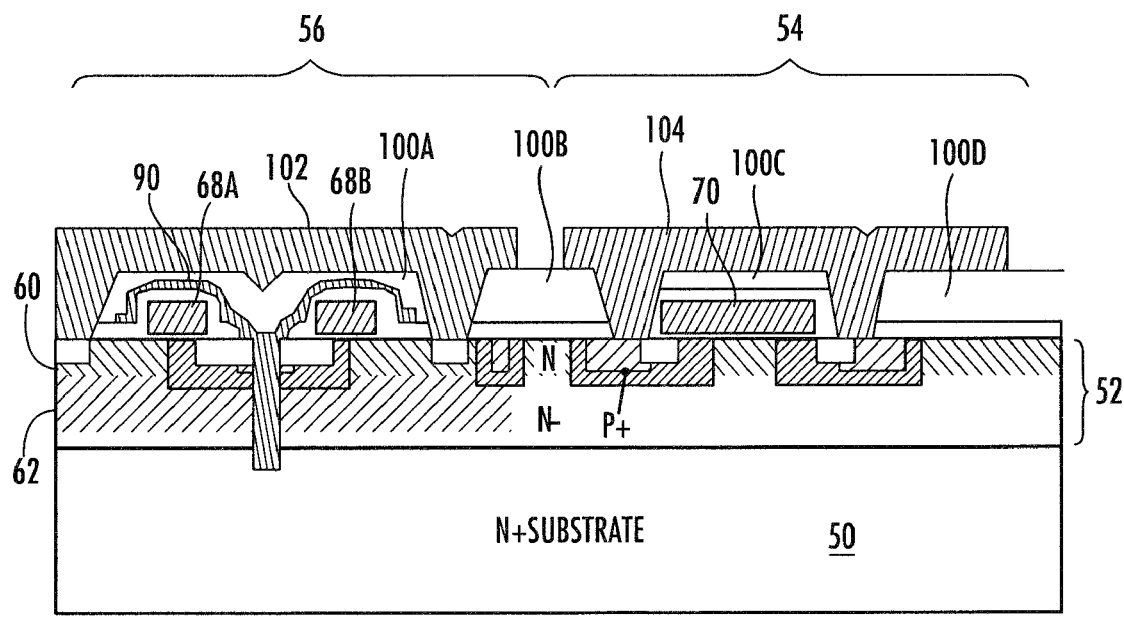

After forming the FIG. 9 structure, a series of process steps are performed to result in the FIG. 10 structure. These process steps can include the following processing acts. A dielectric such as a blanket low temperature oxide (LTO) having thickness of between about 300 Å and about 800 Å, followed by the deposition of a blanket borophosphosilicate glass (BPSG) layer having a thickness of between about 2,000 Å to about 8,000 Å can be formed. The dielectric layer can be treated using a nitrogen flow including an amount of $O_2$ at a temperature of between about 800° C. and about 900° C. for a duration of between about 10 minutes and about 30 minutes. A patterned contact mask is formed to leave unmasked the drain of the high-side device, the source and body of the low side device, and both gates. The dielectric layer is etched down to the structures exposed by the mask, which exposes the substrate and both gate electrodes (for example, polysilicon).

Next, a metal deposition of one or more layers can be performed. In one embodiment, the metal deposition can include a barrier metal deposition of a material such as titanium (Ti) to a thickness of about 100 Å to about 500 Å or a material such as titanium nitride (TiN) to a thickness of between about 500 Å and about 2,000 Å followed by an optional anneal (RTA in the 650-750 C range for example). Subsequently, a thick aluminum or aluminum copper alloy layer (0.5% copper in Al, for example) can be formed in the range of between about 10,000 Å to about 50,000 Å thick. Additionally, an optional tungsten plug can be formed prior to the thick Al deposition to planarize the surface. A metal mask layer, for example a patterned resist layer, is formed, then the patterned metal mask layer is etched to expose the underlying oxide to result in the structure of FIG. 10. FIG. 10 depicts thick dielectric (BPSG) portions 100A-100D, high-side drain metal electrode (to VIN) 102, and low-side source metal electrode 104 (to ground).

It can be seen from FIGS. 2 and 10 that the conductive layer which forms the interrupted TSC can perform several functions. For example, it shorts the N+ source of the high-side device to the buried P+ body. It also shorts both the N+ source and buried P+ body of the high-side device to the heavily doped semiconductor substrate, which is in turn connected to the switched node voltage $V_{sw}$. Further, the conductive layer forms a buried gate shield which, as will be realized by one of ordinary skill in the art, can minimize parasitic capacitance and reduces or eliminates parasitic source inductance. The shield function can shield the gate from the electric field surrounding the overlying drain interconnect to reduce gate-to-drain capacitance ($C_{GD}$), and minimize the gate and gate-drain charges ($Q_G$). These functions are provided by a different a single conductive structure. These structures are thus electrically coupled together by a single conductive structure (the TSC structure).

The top metal structure 102, 104 of FIG. 10 can also perform several functions. For example, it electrically couples to the drain of the high-side device LDMOS device, and connects the drain of the high-side device to $V_{IN}$. Further, it electrically couples to the source of the low-side VDMOS device, and connects the drain of the low-side device to ground. These functions are performed using different parts of a single conductive structure, which can include one or more metal layers. Because the high-side device includes an N-channel device, the resulting structure can have a decreased $RDS_{ON}$ than using a PMOS device with minimized $C_{GD}$ and $Q_G$. Further, because the low-side device also includes an N-channel device, the $RDS_{ON}$*Area and the $RDS_{ON}$*$Q_G$ are minimized. Additionally, parasitic inductance between the power devices and the switched node is reduced or eliminated.

Thus the FIG. 10 structure can include a high-side lateral N-channel diffused MOS (LDMOS) device and a planar vertical diffused MOS (VDMOS) device on the low-side. The device includes an integrated high-side source connection to the substrate (switched node). As depicted in the FIG. 10 cross section, the gate of the LDMOS device and the gate of the VDMOS device are coplanar in a plane which is parallel with the upper surface of the semiconductor wafer section. The two devices share a body region. The LDMOS device is isolated from a highly doped substrate with the same conductivity as the drain of the high-side LDMOS and the low-side VDMOS, using a buried region with the same conductivity type as the body region.

Exemplary Embodiment 2

A second embodiment of the invention is depicted in FIGS. 11-15. The formation of this embodiment includes an additional mask from the method of Exemplary Embodiment 1, and serves to widen the overlap of the metal inside the TSC to provide a larger N+ source to P+ body contact area. The additional mask may result in a device with reduced resistance between the high-side device source and the P-body region compared to the device of Embodiment 1. This device further incorporates a Schottky diode which can be formed by contact between a metal source/body of a low-side VDMOS and an N-doped region of the silicon substrate as described below.

Figure 11:
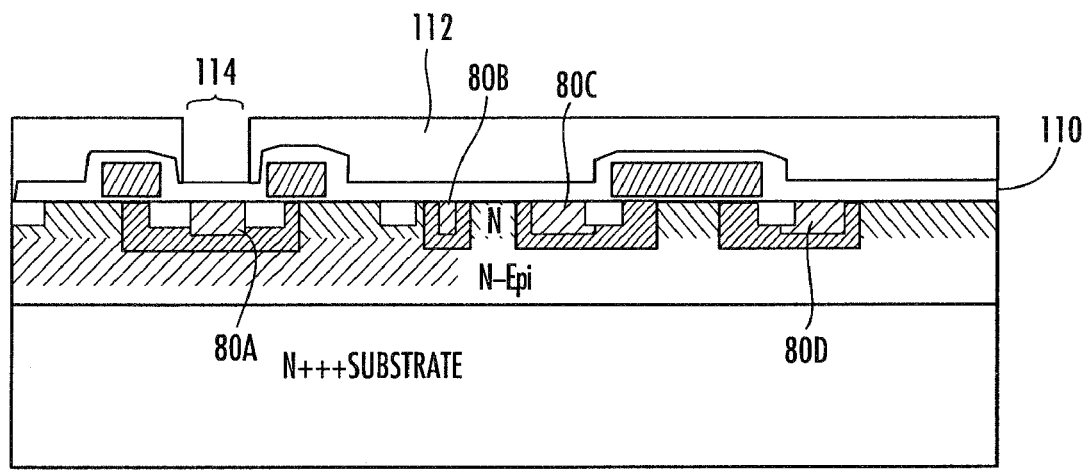
FIGS. 11-15 are cross sections depicting a second embodiment of a method and intervening structures of a voltage converter output structure.

To form this device, a structure similar to that depicted in FIG. 7 can provided, for example using a flow as described for Embodiment 1, possibly with varying mask dimensions, for example when a different voltage rating is required. The mask of FIG. 7 is removed and a blanket conformal dielectric layer 110, for example oxide, is formed according to known techniques to result in the dielectric layer as depicted in FIG. 11. A patterned mask 112 is formed to leave uncovered portions 114 of the dielectric 110 which overlies the high-side source regions 76B, 76C and the high-side P-body contact region 80A as depicted. The exposed portions of the dielectric layer 110 are etched and mask 112 is removed.

Figure 12:
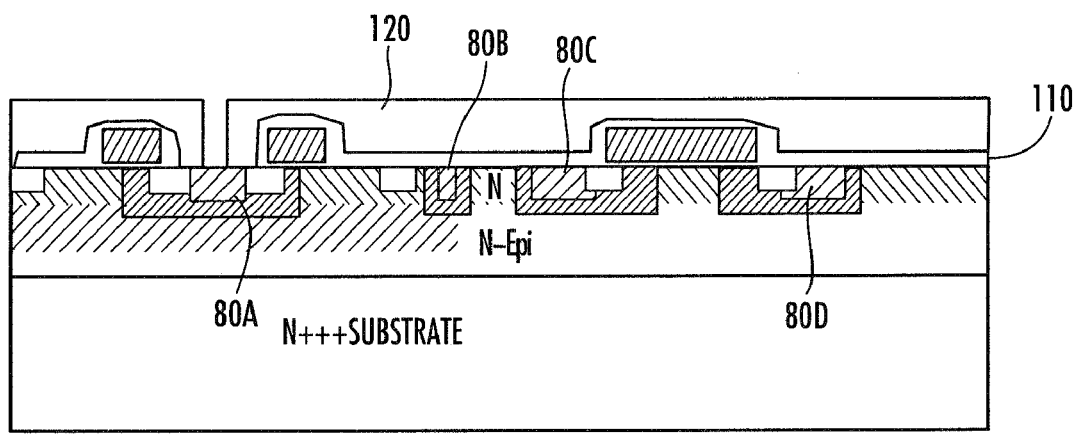
Figure 13:
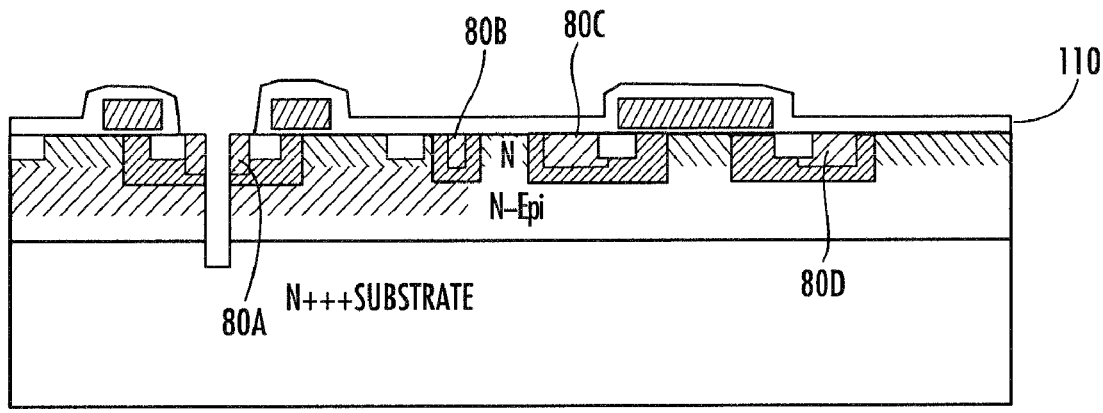
Figure 14:
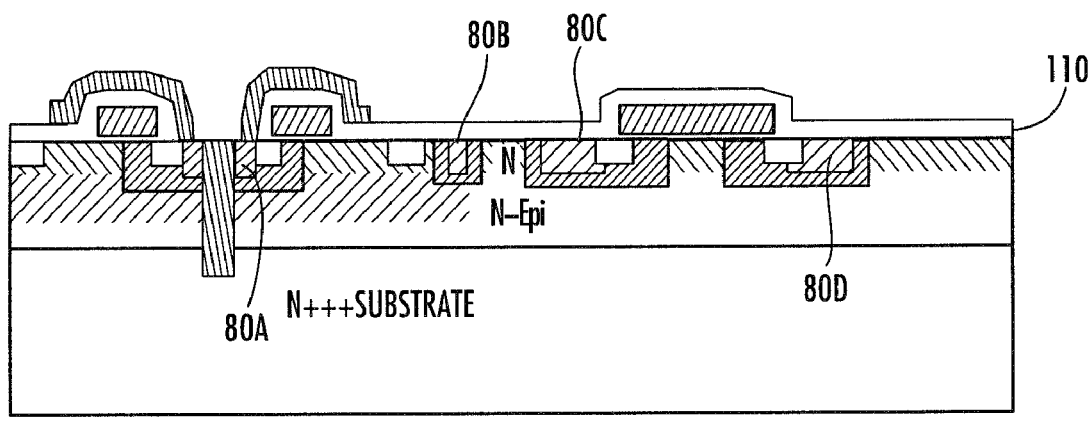

Next, another mask 120 is formed as depicted in FIG. 12 which defines the trench opening. A vertical, anisotropic etch can performed to remove exposed portions of the P+ body contact 80A, the P-type body diffusion region 72A, the buried P+ region 62 in the epitaxial layer 52, and a portion of the heavily doped N+++ substrate 50. This etch defines the interrupted TSC structure depicted in FIG. 2. The depth of the etch will depend on the thickness of the various layers, however the etch should expose a portion of the semiconductor substrate to allow for electrical contact therewith. An exemplary depth will be about equal to the thickness of the epitaxial layer, plus about 5,000 Å. After the etch, an optional N+ trench bottom implant can be performed to enhance electrical contact with a subsequently formed conductive layer within the trench, and an optional oxide wet etch can also be performed to pull back the dielectric layer prior to deposition of the conductive layer. If an etch of the dielectric layer is performed, the etch is terminated before removing the entire thickness of the layer, such that between about 200 Å and about 1,000 Å remains.

After preparing the trench opening and performing optional or other processing, one or more conductive layers are formed within the trench opening and over exposed surfaces. A layer of tungsten, tungsten silicide (WSi$_x$) is deposited or otherwise formed. Another material such as titanium nitride (TiN) can also be used, particularly if subsequent processing steps are performed at temperatures below about 900° C. Cobalt silicide may also function sufficiently. To ensure complete filling of the trench opening, the thickness of the conductive layer should be at least half as thick as the width of the trench opening.

Next, the conductive layer can be patterned, for example using a patterned gate shield mask of photoresist, then etched using an etch appropriate for the material of the conductive layer, stopping on the underlying dielectric layer. The mask is removed to result in a structure similar to that depicted in FIG. 14. An anneal between about 800° C. to about 1,000° C. can be performed, depending on the conductive material used, for between about 30 seconds and about 60 seconds in a nitrogen ambient. Processing can continue using a method similar to the previous embodiment to result in a structure similar to that depicted in FIG. 15.

Figure 15:
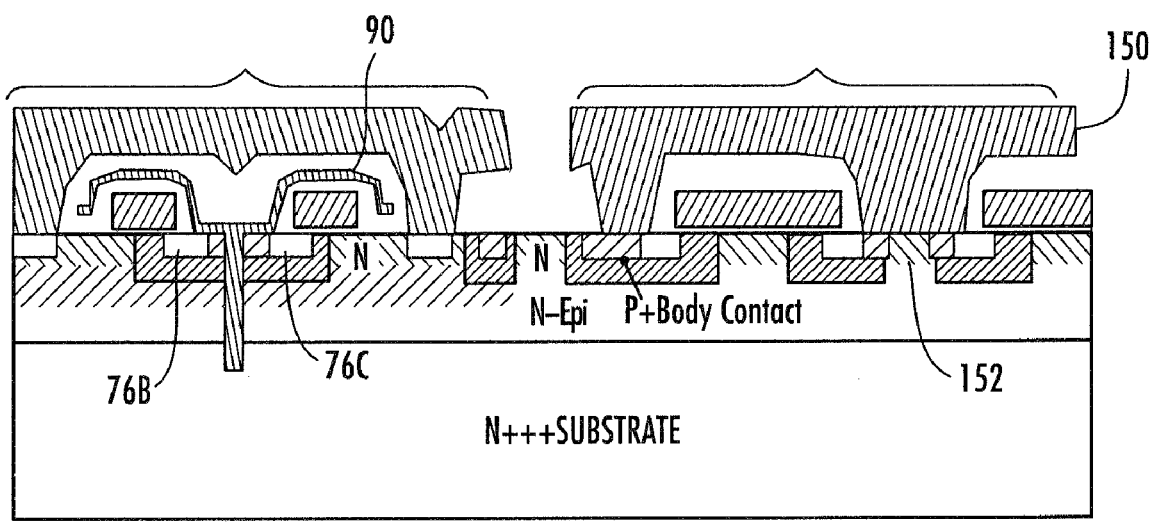

In comparing FIGS. 10 and 15, it can be seen that the contact area between the high-side source regions 76B, 76C and P-body contact 80A to the overlying metal 90 is larger in FIG. 15 than in FIG. 10, which results from the additional mask depicted in FIG. 11, at the cost of an additional mask. In some instances, the benefits of decreased resistance in a functioning device may overcome the disadvantages of the additional mask. Further, depending on the device being produced, it may be possible to incorporate the FIG. 11 mask with other processing elsewhere on the device.

The FIG. 15 device further includes an integrated Schottky diode which results from contact of the low-side VDMOS source/body 150 formed by the final metal structure contacting the N-type silicon region 152.

Further, the TSC provides an integrated high-side source connection to the substrate (switched node).

Exemplary Embodiment 3

A third embodiment is depicted in FIGS. 16-25. This embodiment forms a lateral N-channel DMOS high-side device and a vertical N-channel vertical DMOS low side device which includes field isolation between devices.

Figure 16:
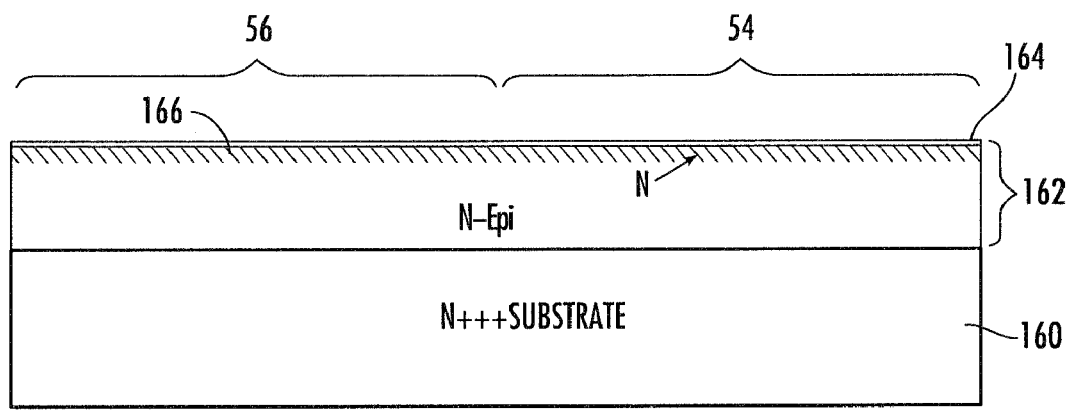
FIGS. 16-25 are cross sections depicting a third embodiment of a method and intervening structures of a voltage converter output structure.
Figure 17:
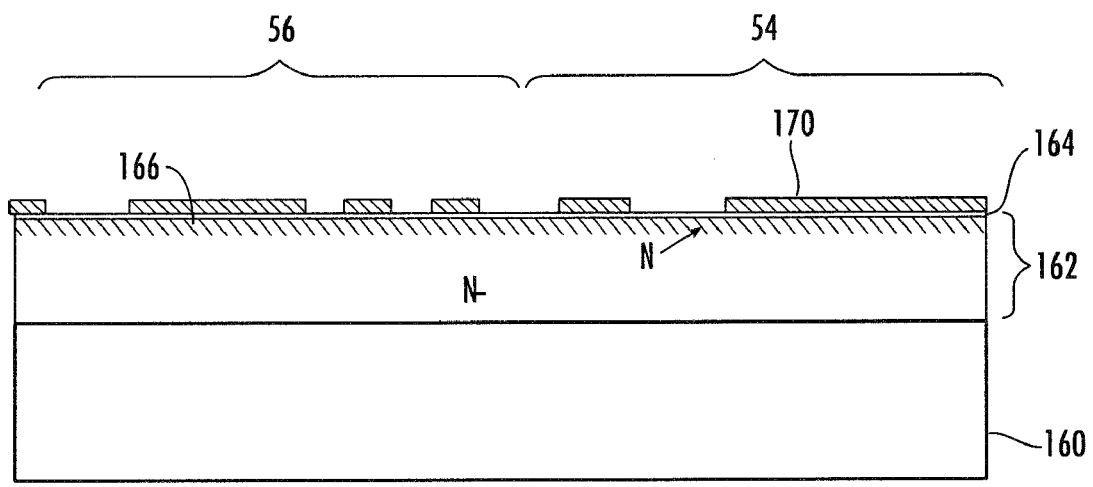

FIG. 16 depicts a first processing step including a semiconductor substrate 160, such as silicon, gallium arsenide, silicon carbide, or gallium nitride, etc., heavily doped N+++ to achieve a low-contact resistance, with an N-type dopant such as arsenic or phosphorus to provide a heavily doped substrate. An epitaxial layer 162 is formed on the semiconductor substrate 160, and a pad dielectric 164, such as a pad oxide between about 150 Å and about 400 Å is formed on the epi layer. An upper surface of the epi layer is doped through the pad oxide with an N-type dopant to provide NDRIFT implant 166 for the drain of the High-Side device, and a structure similar to that depicted in FIG. 16.

Next, after the formation of a blanket pad oxide, a blanket nitride is deposited (preferably using LPCVD, to a thickness of 500 Å to 2,000 Å), and patterned using an active area mask formed over the nitride. The nitride is etched using the active area mask as a pattern, then the active area mask is removed to result in the FIG. 17 structure including patterned nitride 170. An optional NDRIFT or NJFET implant can be performed, which will be self-aligned to a field oxide layer formed as described below. These additional N-type implants can be used to reduce the resistance of the low-side and high-side transistors.

Figure 18:
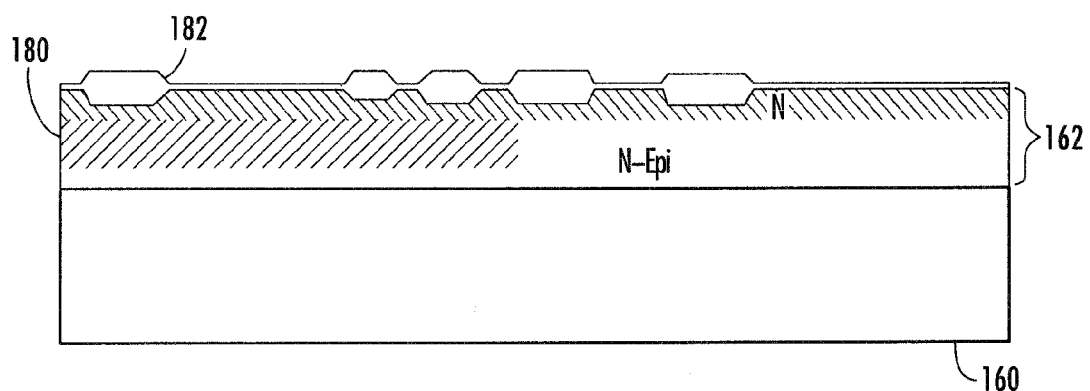

After the nitride is patterned, a deep body mask is used to pattern a thick resist layer over the low-side device, to protect it from a subsequent high-energy implant needed to form a buried body region of the Low-side device. A P-type implant is performed through the nitride mask, for example using boron at an energy of between about 500 KeV and about 2,000 KeV. Optional N-type implants to adjust the N-drift (drain) of the LDMOS device can also be done at this time. After removing the resist, an anneal can be performed to diffuse the HS-LDMOS deep body implant 180 as depicted in FIG. 18. A field oxidation process is performed using known techniques, then the nitride mask is removed, to result in the FIG. 18 structure including field oxide 182.

A sacrificial oxide is grown and stripped, which also removes the remaining pad oxide and exposes the N-epi layer between the field oxide. A gate oxidation is performed, then a blanket gate layer is formed. The gate layer can include a polysilicon gate layer in the range of between about 1,500 Å and about 5,000 Å. If the polysilicon is not in situ doped during its deposition, the polysilicon can be doped by N-type ion implantation (high dose arsenic or phosphorus implant) or N-type diffusion (POCl$_3$). Formation of the blanket polysilicon gate layer can include a subsequent optional silicide formation as well, for example WSi$_x$, to a thickness of between about 500 Å to about 2,500 Å which can be helpful to reduce the gate resistance. An optional capping layer, for example an oxide cap between about 200 Å and about 2,000 Å, can be formed over the blanket gate layer to protect the silicide metal during subsequent high-temperature processing steps. A gate mask is then patterned over the gate electrode material to allow for etching of the gate material (stopping on the underlying gate oxide), to result in the gate 190A, 190B of the high-side transistor and gate 190C of the low-side transistor, as well as interconnections, to result in a structure similar to FIG. 19.

Figure 19:
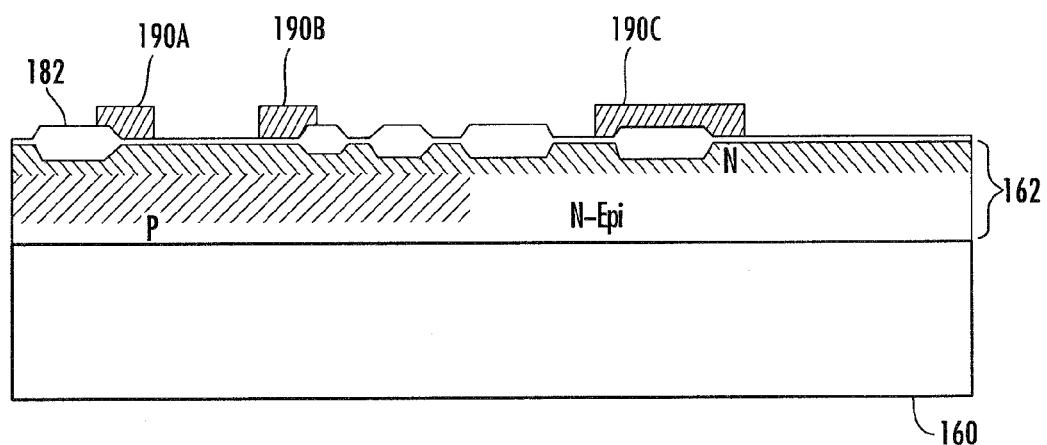

A patterned shallow body mask, for example a patterned resist mask, is formed over the FIG. 19 structure, then a shallow boron implant can be performed to form P-body regions 200A-200D of the high-side and low-side devices. The resist is stripped and a shallow body anneal can be performed to result in a structure similar to FIG. 20.

Figure 20:
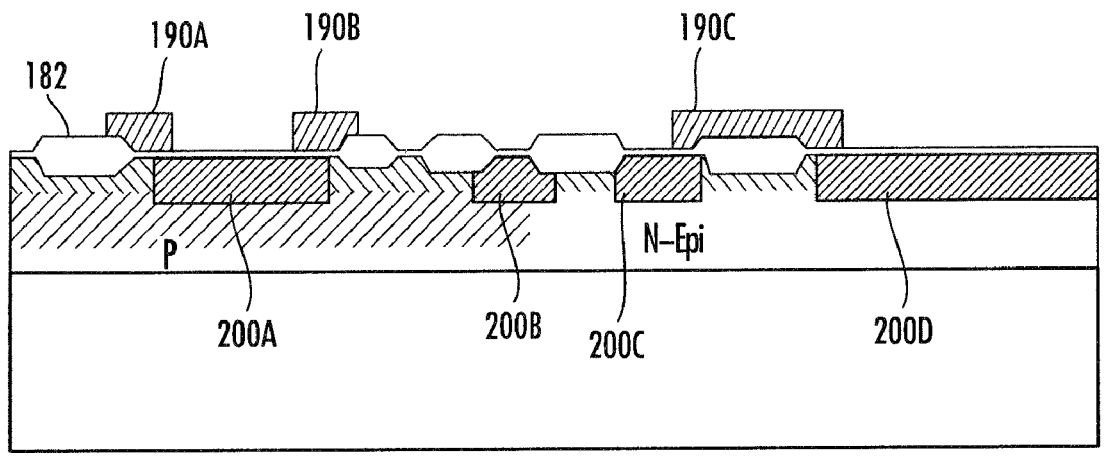
Figure 21:
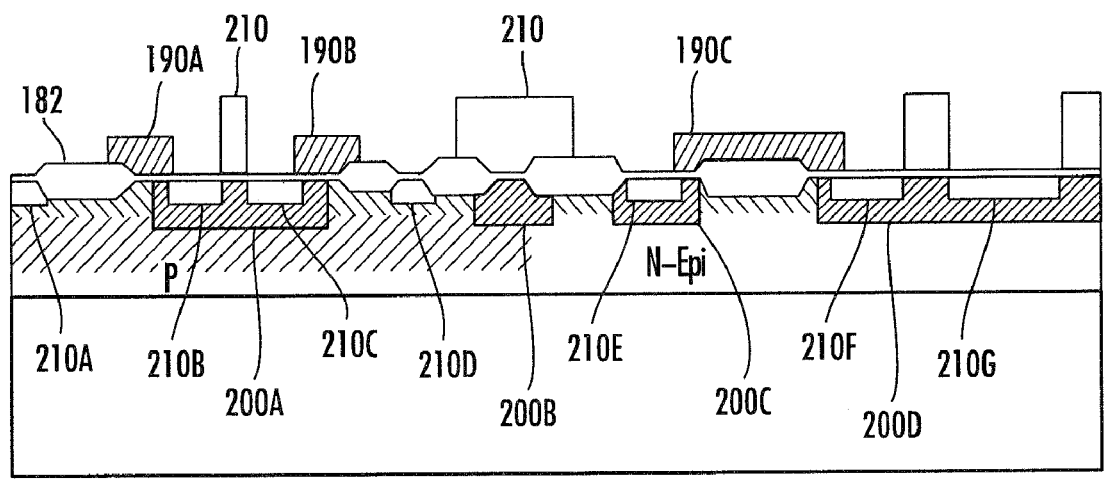

As depicted in FIG. 21, an N+ source mask is formed over the FIG. 20 structure and a shallow N+ source implant is performed. The N+ source implant can include the use of arsenic at a dose of between about 1E15 atoms/cm$^2$ and about 1E16 atoms/cm$^2$ at an energy of between about 30 KeV to about 80 KeV. A subsequent source anneal with a flow of some oxygen can be performed to result in a structure similar to that depicted in FIG. 21 including implanted regions 210A-210G.

Figure 22:
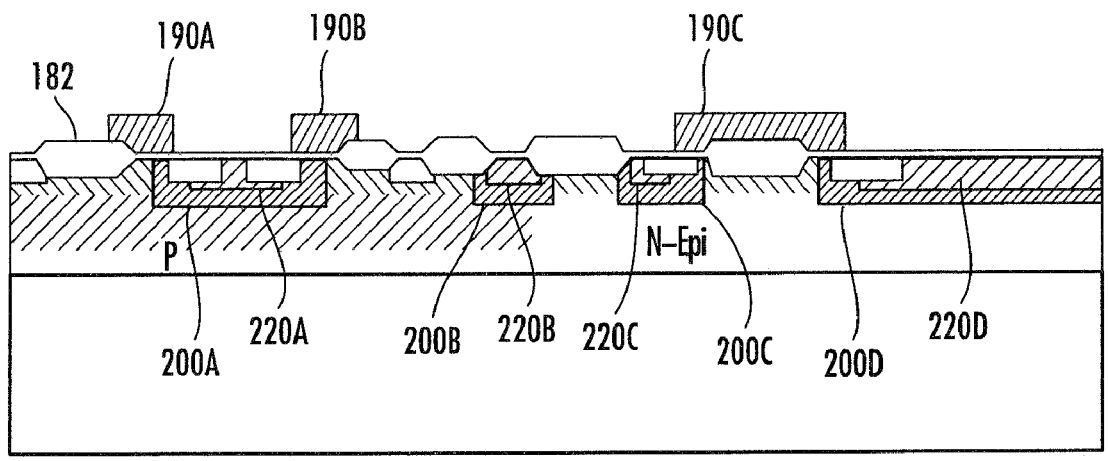

To result in a structure similar to FIG. 22, a patterned body contact mask is formed over the FIG. 21 structure, and a P+ body contact implant is performed. The body contact implant can include an implant of difluoroboron ($BF_2$) to a dose of between about 1E15 atoms/cm$^2$ to about 5E15 atoms/cm$^2$ at an energy of between about 20 KeV to about 100 KeV. The initial body contact implant can be followed by an optional deeper implant of boron-11 (B11) to a dose of between 5E14 atoms/cm$^2$ to about 5E15 atoms/cm$^2$ at an energy of between about 30 and 180 KeV. The mask is removed, then a P+ body contact anneal can be performed to diffuse the implant as depicted in FIG. 22 including regions 220A-220D.

Figure 23:
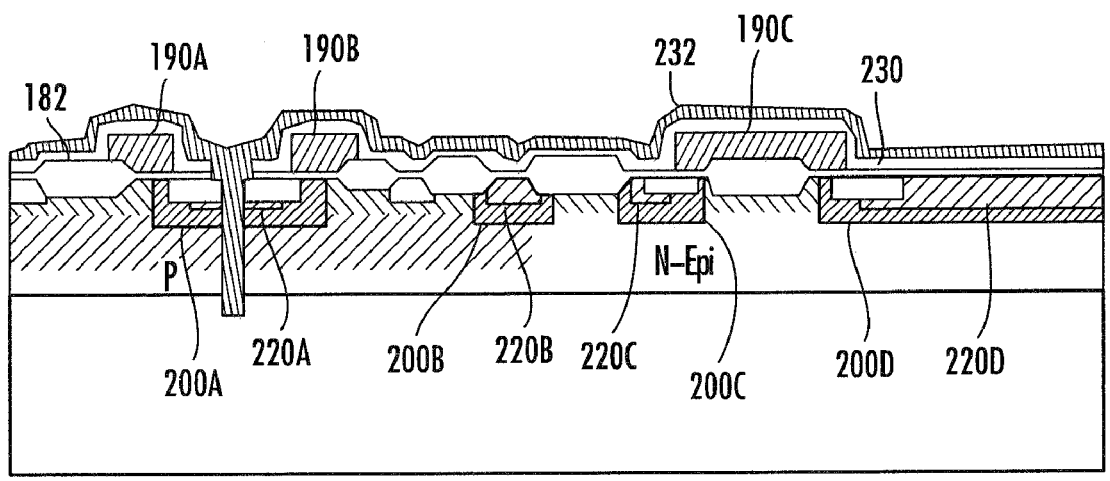

After forming a structure similar to FIG. 22, a blanket conformal oxide deposition 230 can be performed, and a patterned substrate contact mask can be formed which will define a trench-substrate-contact (TSC) at a location within the high-side device depicted in FIG. 23. One or more anisotropic dry etches are performed to remove exposed portions of the blanket conformal oxide, the gate oxide, a portion of the P-body contact region in the epi, the deep boron implant in the epi, and a portion of the semiconductor substrate. After etching, the patterned substrate contact mask is removed, a wafer clean can be performed, and a slight oxide wet etch can be used to clear any native or other oxide to expose the top of the N+ source regions within the N-epi. One or more blanket conductive layers 232 can be formed to result in the FIG. 23 structure. The blanket conductive layers 232 can include various metals, for example one or more of W, $WSi_x$, TiN, both TiN and W, $CoSi_x$.

Figure 24:
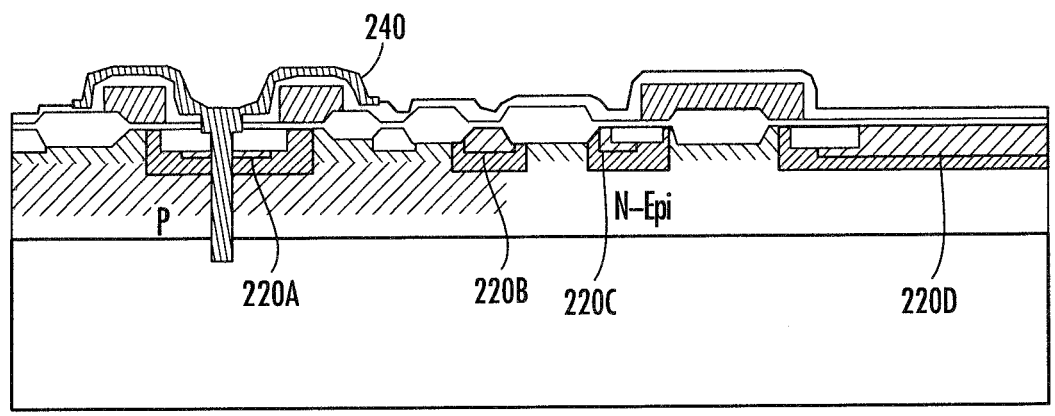

A patterned substrate contact and gate shield mask is formed over the FIG. 23 structure, then the one or more conductive layers are etched down to the oxide as depicted in FIG. 24. This etch will form the buried gate shield and switch node contact structure 240 as depicted. Processing can continue in accordance with techniques of previous embodiments to result in a structure similar to that depicted in FIG. 25 including BPSG 250 and metal 252A, 252B.

Figure 25:
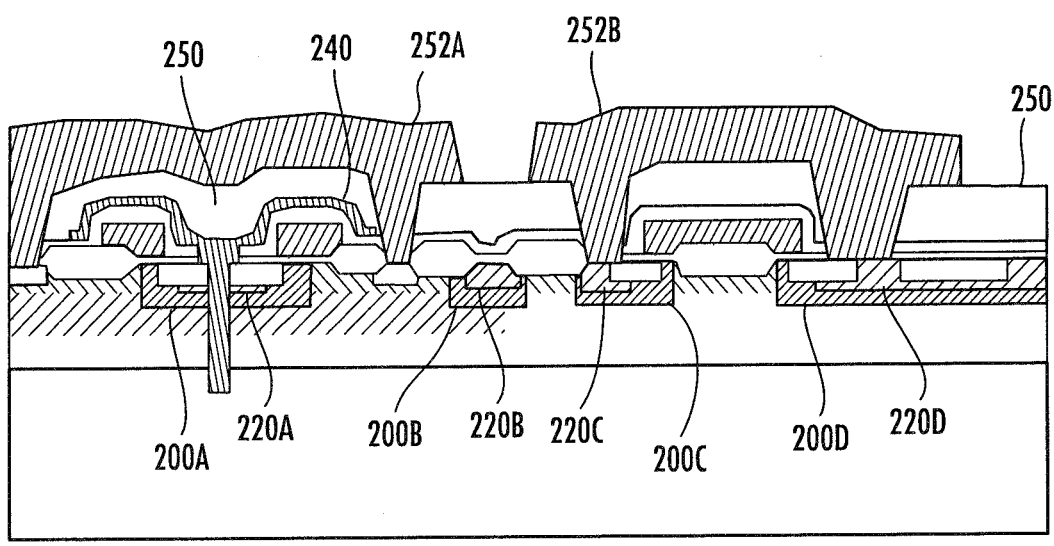

Thus the FIG. 25 device includes an integrated high-side source connection to the substrate (switched node) with field oxide in the drain regions which can provide improved isolation between devices and can reduce $C_{GD}$. This embodiment can result in a reduced electric field at the drain side of the gate of the high-side device because of a thicker oxide under the gate oxide in that region, compared to previous embodiments. Also, using field oxide can enable to elimination of the body mask since the thick oxide can be formed in regions where one wants to block this implant from exposed silicon regions. The high-side LDMOS device and the low-side VDMOS device share a gate oxide and a body region.

Exemplary Embodiment 4

In this embodiment, a buried layer can be used to form a buried body of a high-side LDMOS device, which can replace the high-energy implant used in earlier embodiments. Using a buried layer to form the deep body region of the high-side LDMOS device can enable a higher breakdown voltage, for example since the depth of the buried P-region used to isolate the high-side LDMOS drain from the N+ substrate can be deeper than what may be feasible using ion implantation techniques through the silicon. For the LDMOS, the breakdown voltage $BV_{DSS}$ may be limited by breakdown between the N+ drain contact and the peak doping of the deep P-Body region. Therefore, the deeper the deep P-body region, the higher the HS breakdown voltage. With an increasing epitaxial layer thickness between the P+ buried layer and the N+ drain, $BV_{DSS}$ can also increase.

Figure 26:
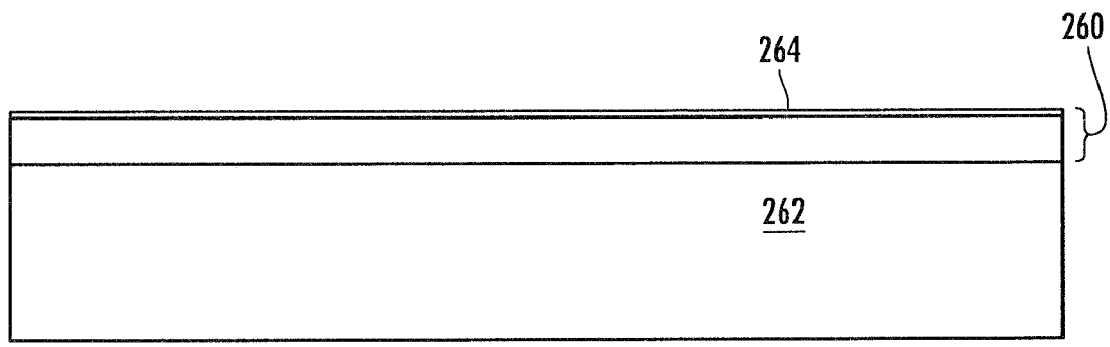
FIGS. 26-30 are cross sections depicting a fourth embodiment of a method and intervening structures of a voltage converter output structure.

An exemplary method for embodiment 4 is depicted in FIGS. 26-30. In FIG. 26, an N-epitaxial layer 260 is formed over a heavily doped N+++ semiconductor substrate 262, for example by doping with arsenic, with its output electrically coupled (or subsequently electrically coupled) to the converter device inductor as described for previous embodiments. A pad dielectric 264, such as pad oxide, between about 150 Å to about 400 Å can be formed on the N-epi to result in a structure similar to that depicted in FIG. 26. A deep body mask is formed to protect the low-side device and to expose the N-epi of the high-side device. Processing steps with this embodiment can be similar to previous embodiments, except that the deep P-body region can be formed prior to the growth of an epitaxial layer.

Figure 27:
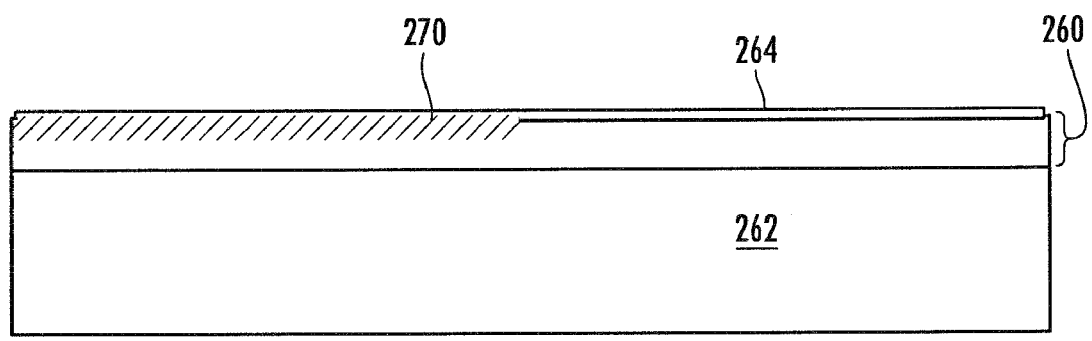

Next, a deep body P-type implant 270 can be performed to result in a structure similar to FIG. 27. The deep body P-type implant can include a boron implant at an energy of between about 20 KeV to about 200 KeV to a dose of between about 1E13 atoms/cm$^2$ and about 1E15 atoms/cm$^2$. A subsequent deep body anneal, for example using rapid thermal processing (RTP) at about 1,100° C. for a duration of between about 30 seconds and 60 seconds in an $N_2$ ambient would sufficiently diffuse the deep body implant. A furnace anneal is also contemplated.

Figure 28:
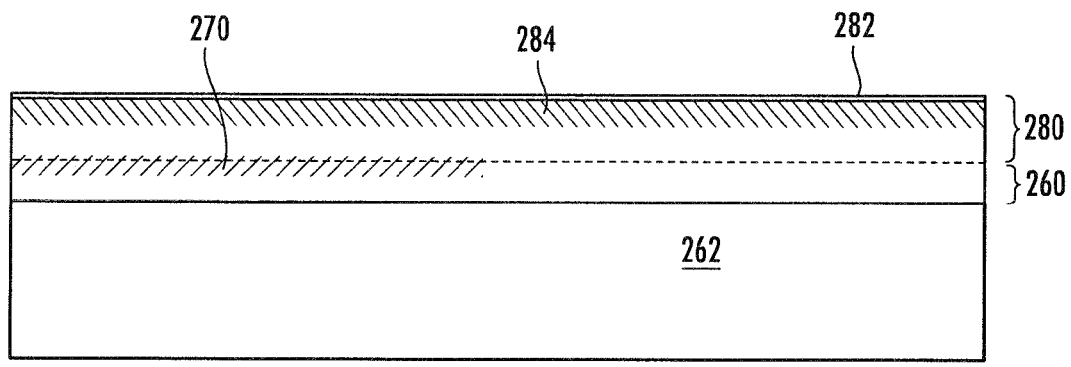
Figure 29:
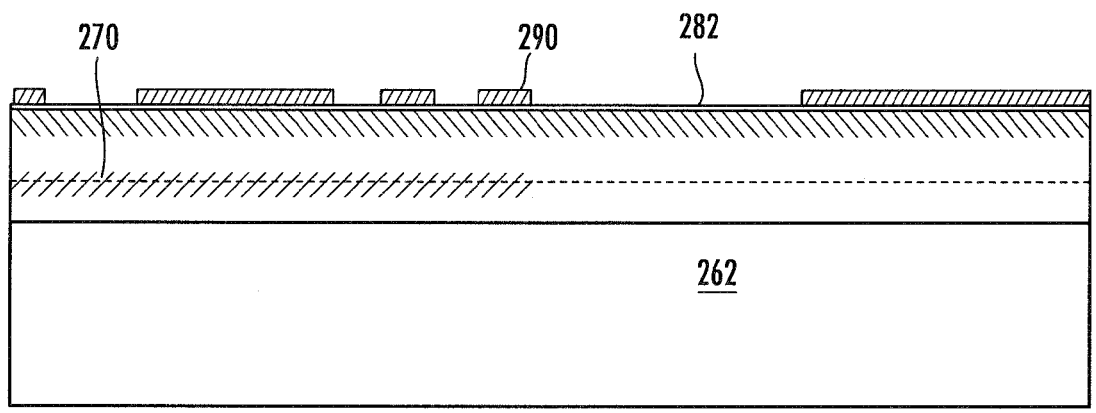

Subsequently, with reference to FIG. 28, the pad oxide is stripped and a second N-epitaxial layer 280 is grown in accordance with known techniques. The second N-epi layer can be formed to achieve a total epitaxial layer thickness adequate to support the required drain voltage of the vertical low-side device. A pad oxide 282 is formed over the second N-epi layer, and a blanket N-drift implant 284 is performed to result in the FIG. 28 structure.

Next, a blanket nitride layer can be formed over the pad oxide, and an patterned active area mask can be formed to define active device regions. The nitride is etched and the mask is removed to result in a structure similar to FIG. 29 including patterned nitride 290.

Figure 30:
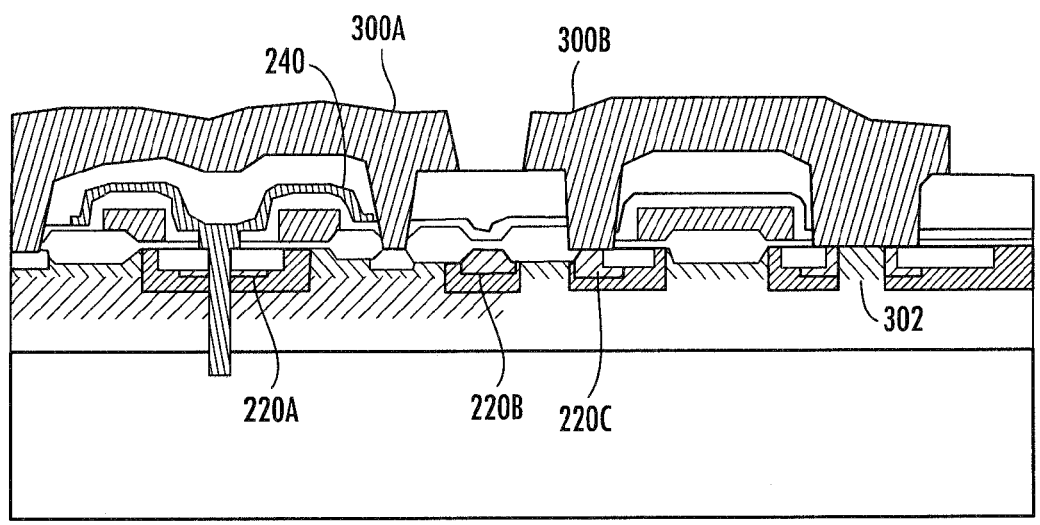

At this point in the processing, a flow similar to the flow of FIGS. 17-24 can be provided (omitting the deep body implant performed between FIGS. 17 and 18) to form field oxide and other device structures to result in a structure similar to that depicted in FIG. 30. The structure depicted includes a lateral DMOS high-side device and a planar VDMOS low-side device. An integrated Schottky diode results in the planar device from contact between the final metal structure and the N-doped silicon. The trench-substrate-contact structure forms an integrated high-side source connection to the substrate (switched node). The field oxide in the drain regions can reduce $C_{GD}$.

Exemplary Embodiment 5

In another embodiment, a buried layer is used to form a buried by of a high-side LDMOS device. A self-aligned implant can be used to form a low-side vertical MOSFET to create a profile having two physical steps which can improve electrical robustness during operation of the device, and can help to target the breakdown voltage. In addition, the structure may minimize $RDS_{ON}$.

Figure 31:
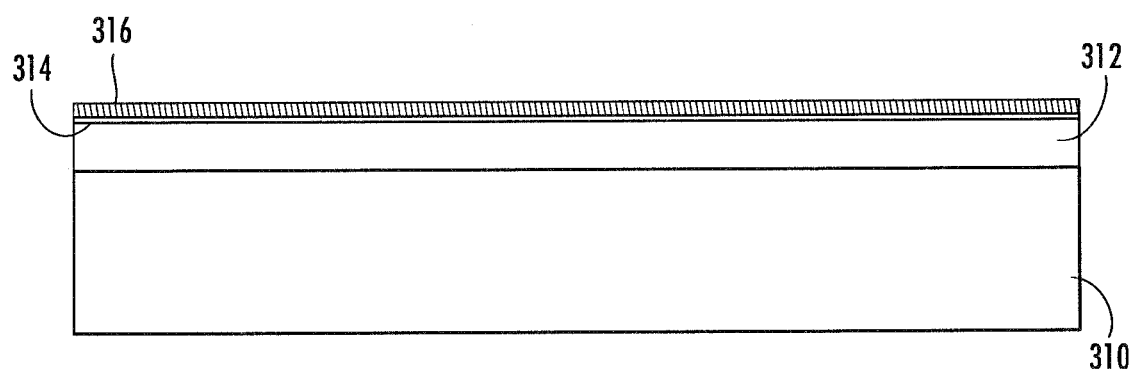
FIGS. 31-37 are cross sections depicting a fifth embodiment of a method and intervening structures of a voltage converter output structure.
Figure 32:
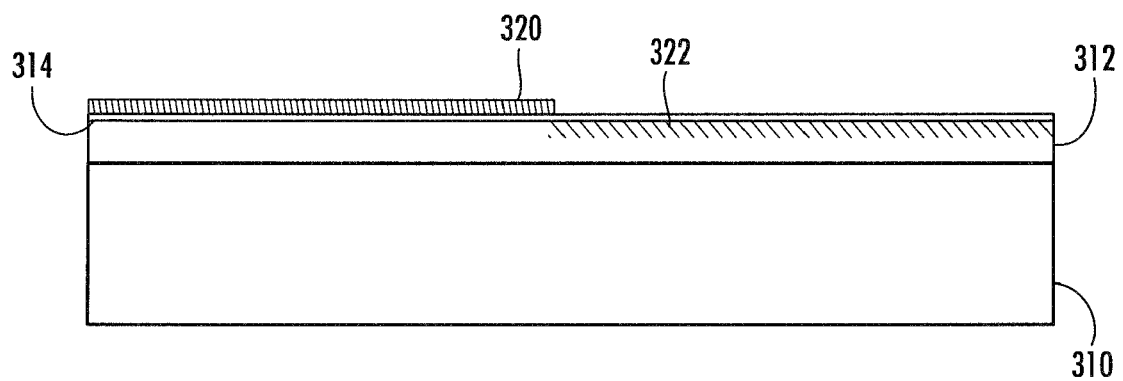

Various exemplary processing steps and structures for embodiment 5 are depicted in FIGS. 31-37. As depicted in FIG. 31, a heavily doped semiconductor substrate can be formed in accordance with techniques previously described. An N-doped epitaxial layer 312, for example incorporating arsenic as an N-type dopant, is formed to a thickness of between about 5,000 Å and about 20,000 Å. Subsequently, a pad dielectric 314 such as a pad oxide between about 150 Å and about 400 Å, and a nitride layer 316 between about 300 Å and about 1,500 Å can be formed to result in a structure similar to FIG. 31.

Next, an optional step can be performed which includes forming patterned buried mask of a material such as photoresist formed over the nitride to expose the nitride over the low-side device and the epitaxial layer of the low-side device, and to protect the high-side. The exposed nitride is etched to result in patterned nitride 320, the patterned buried mask layer is removed, and a phosphorous implant for an N-type VDMOS drain is performed to a dose of between about 1E12 atoms/cm$^2$ to about 5E14 atoms/cm$^2$ at an energy of between about 30 KeV to about 90 KeV can be performed at a tilt of about 7°. If performed, this optional implant 322 can be done to reduce the drain resistance of both devices. The mask is then removed to result in the FIG. 32 structure, or a similar structure.

Figure 33:
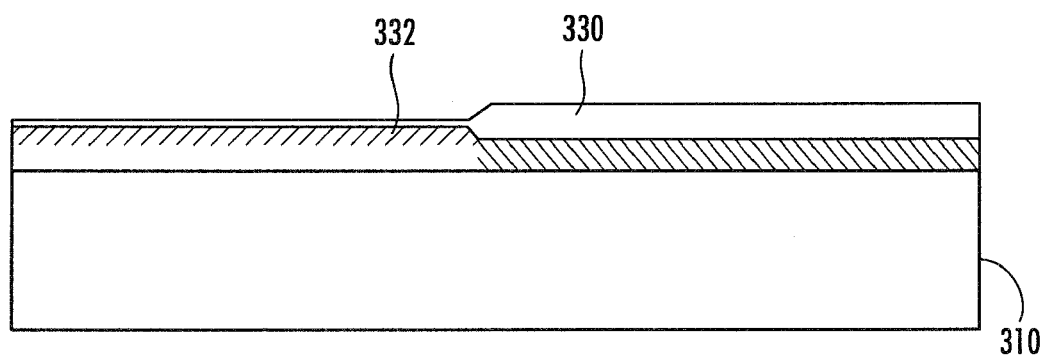
Figure 34:
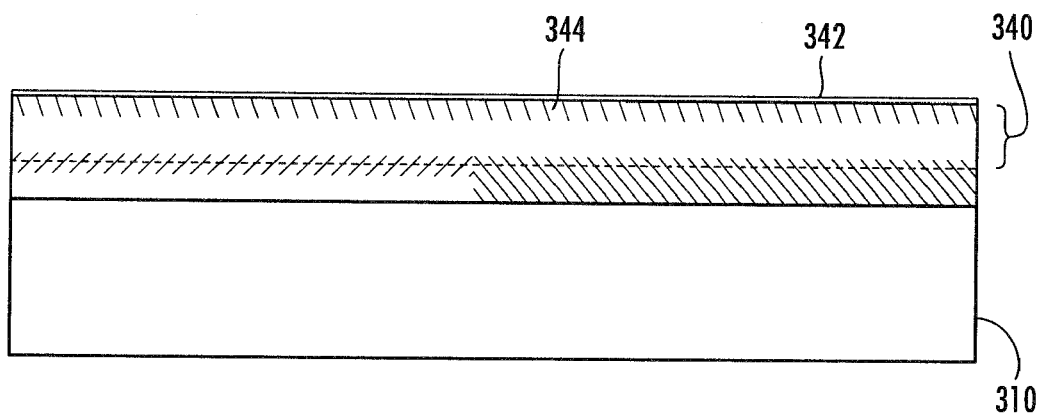
Figure 35:
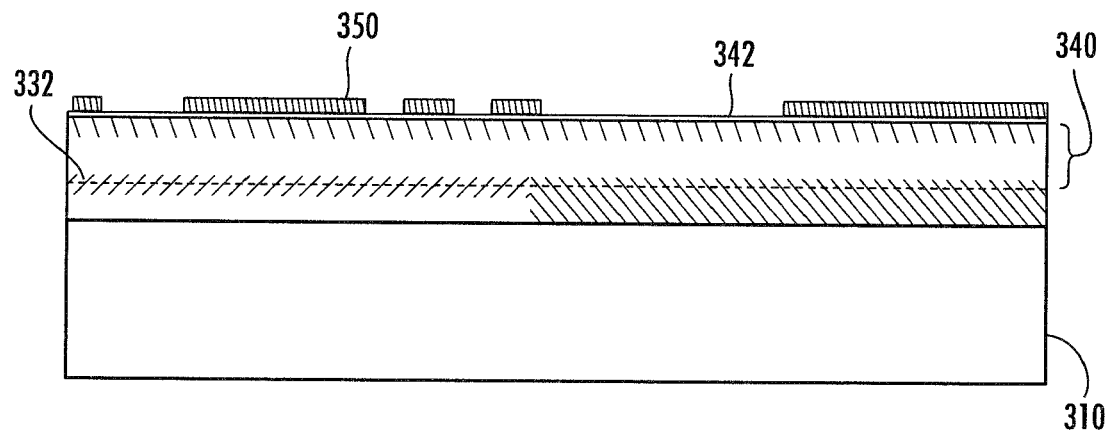
Figure 36:
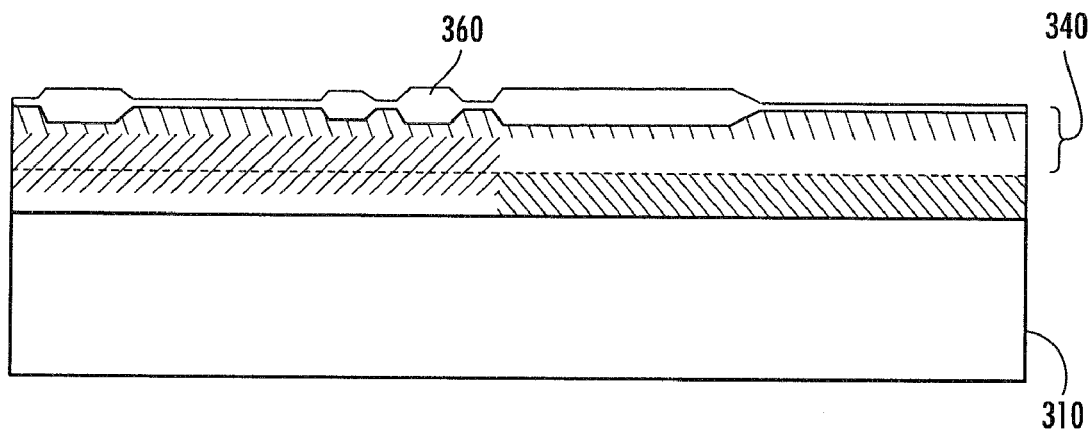

A thermal oxidation can be performed to result in a thermally grown oxide 330 over the low-side device as depicted in FIG. 33, then the nitride is stripped and a blanket P-buried layer implant 332 is performed, for example using a shallow boron implant, at an energy which penetrates through the pad oxide but fails to penetrate through the thermal oxide. A boron implant at an energy of between about 10 KeV to about 60 KeV and a dose of between about 1E13 atoms/cm$^2$ and about 1E15 atoms/cm$^2$ at a 7° tilt would be sufficient. A subsequent anneal can result in the FIG. 33 structure. The field oxide can be used as alignment marks for precise mask alignment during subsequent photolithographic steps since the field oxide forms a step in the wafer.

After forming the FIG. 33 structure, an oxide strip and a wafer clean is performed to remove the pad oxide and the thermal oxide. Another epitaxial growth 340 is performed to result in an increase in the epitaxial by between about 5,000 Å to about 6,000 Å, depending on the breakdown voltage requirements of the completed device. A pad oxide 342 is formed, then a blanket N-drift implant 344 is completed to result in a structure similar to FIG. 34.

Subsequently, a nitride layer is formed then etched using a patterned active area mask. The patterned active area mask is removed to result in the FIG. 35 structure including patterned nitride 350. A field oxidation then a nitride strip is performed to result in a structure similar to FIG. 36 including field oxide 360.

Figure 37:
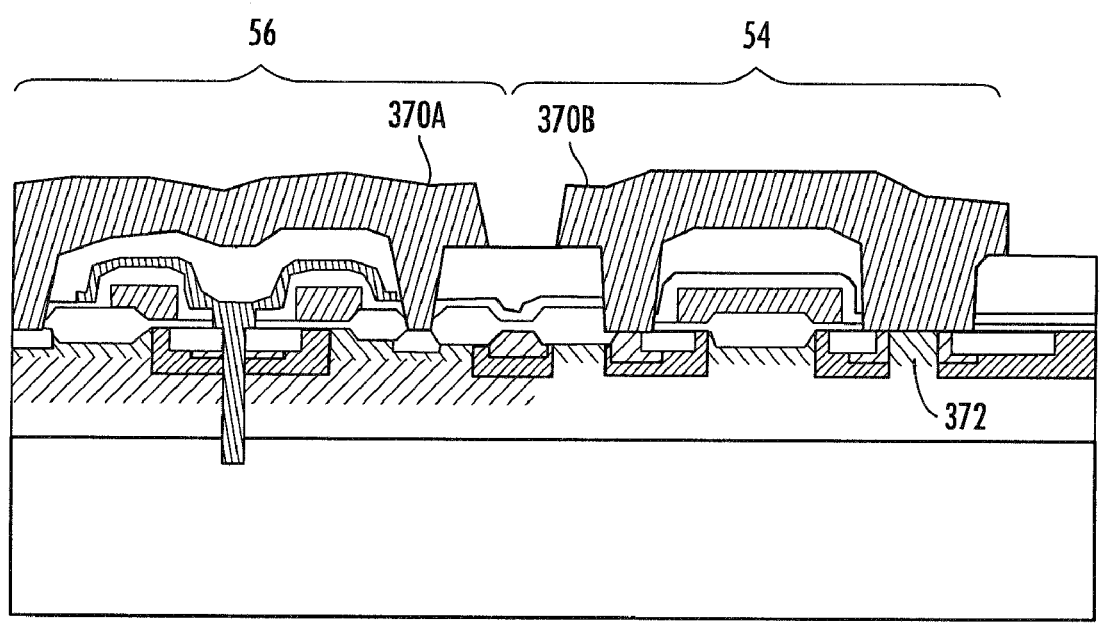

Various processing acts are performed in accordance with previous embodiments to result in a structure similar to that depicted in FIG. 37. The structure of FIG. 37 includes a lateral DMOS high-side device 56 and a planar low-side device 54. An integrated Schottky diode results from contact between the final metal structure 370B and the n-doped silicon substrate 372 of the planar VDMOS device. With this structure, field oxide remains in the drain region of the high-side LDMOS device only.

Exemplary Embodiment 6

A method similar to that depicted in FIGS. 38-45 can provide a twin buried layer based on a single epitaxial layer process. This embodiment includes an implantation of fast diffusers (boron and phosphorous, for example) into a heavily doped N+++ semiconductor substrate, which is doped by a slow diffuser such as arsenic. A high-side LDMOS device can have its body tied directly to a switch node, and thus there is little or no drawback in having its body in direct contact with the highly doped N+++ substrate.

Figure 38:
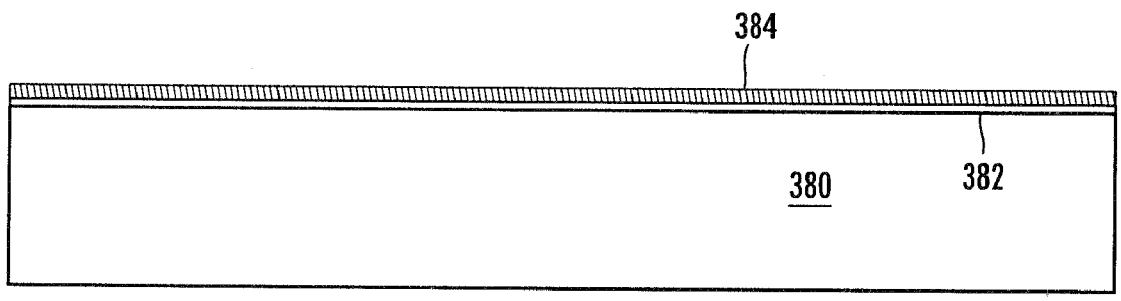
FIGS. 38-44 are cross sections depicting a sixth embodiment of a method and intervening structures of a voltage converter output structure.

As depicted in FIG. 38, a semiconductor substrate 380 is doped with an N-type slow diffuser such as arsenic to provide a heavily doped substrate. The substrate, in accordance with previous embodiments, can have its output electrically coupled (or subsequently electrically coupled) to an inductor of a voltage converter device. A pad oxide 382 between about 150 Å to about 400 Å is formed on the semiconductor substrate, then a nitride layer 384 is deposited to a thickness of between about 300 Å to about 1,500 Å to result in a structure similar to FIG. 38.

Figure 39:
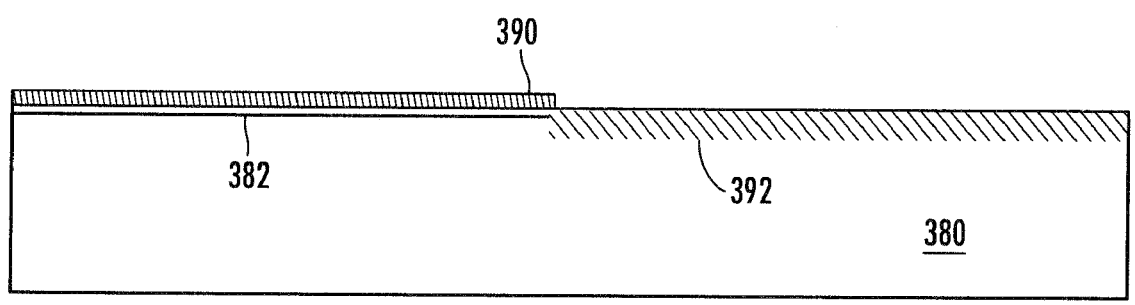

As depicted in FIG. 39, a patterned nitride mask 390 is formed to protect the high-side device and expose the low-side device, then an optional phosphorous implant 392 for an N-type low-side VDMOS device is performed. The implant can include a dose of between about 1E12 atoms/cm$^2$ to about 5E15 atoms/cm$^2$ at an energy of between about 30 KeV to about 90 KeV at a tilt of about 7°. The resist can then be stripped to result in a structure similar to FIG. 39.

Figure 40:
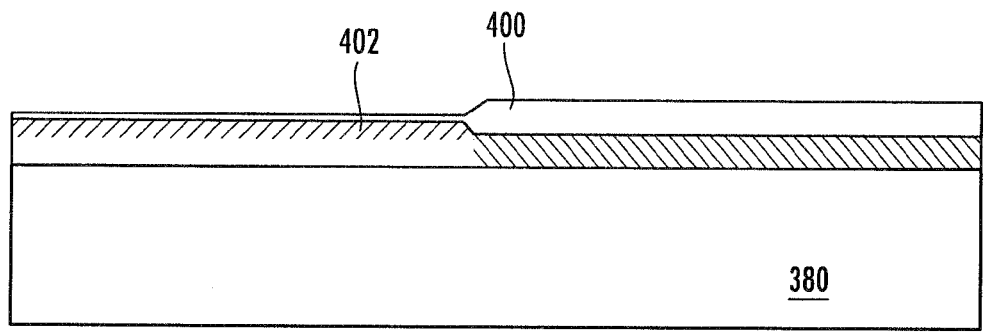

Subsequently, a thermal oxidation can be performed to result in the thermal oxide 400 of FIG. 40. The nitride of FIG. 39 is subsequently stripped, and a blanket shallow boron P-body buried layer implant 402 can be performed which penetrates through the pad oxide but does not penetrate through the thicker, thermal oxide. A boron dose of between about 1E13 atoms/cm$^2$ and about 1E15 atoms/cm$^2$ at an energy of between about 10 KeV and about 60 KeV at a tilt of about 7° would be sufficient. An anneal can then be performed to diffuse the P-body buried layer to result in the FIG. 40 structure. The field oxide can be used as alignment marks for precise mask alignment during subsequent photolithographic steps since the field oxide forms a step in the wafer.

Figure 41:
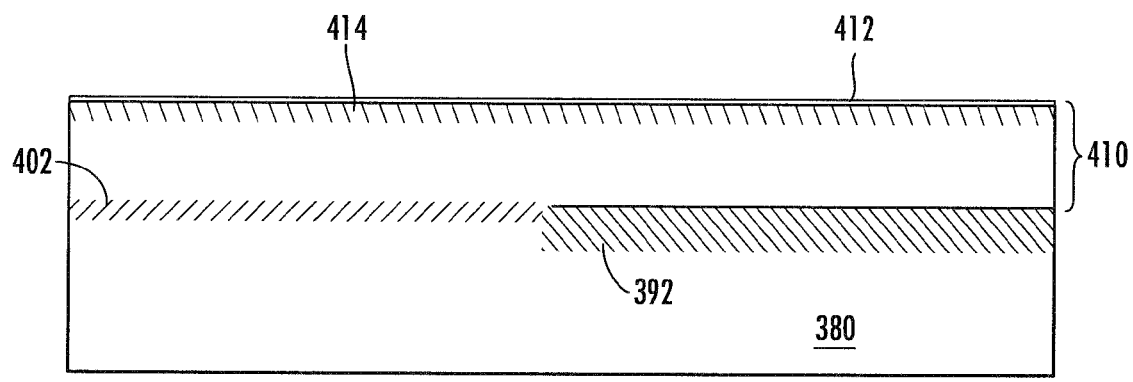
Figure 42:
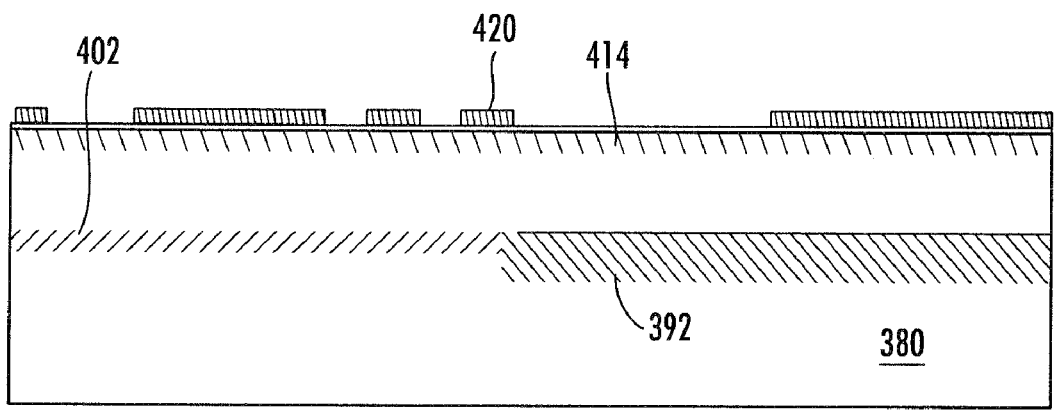
Figure 43:
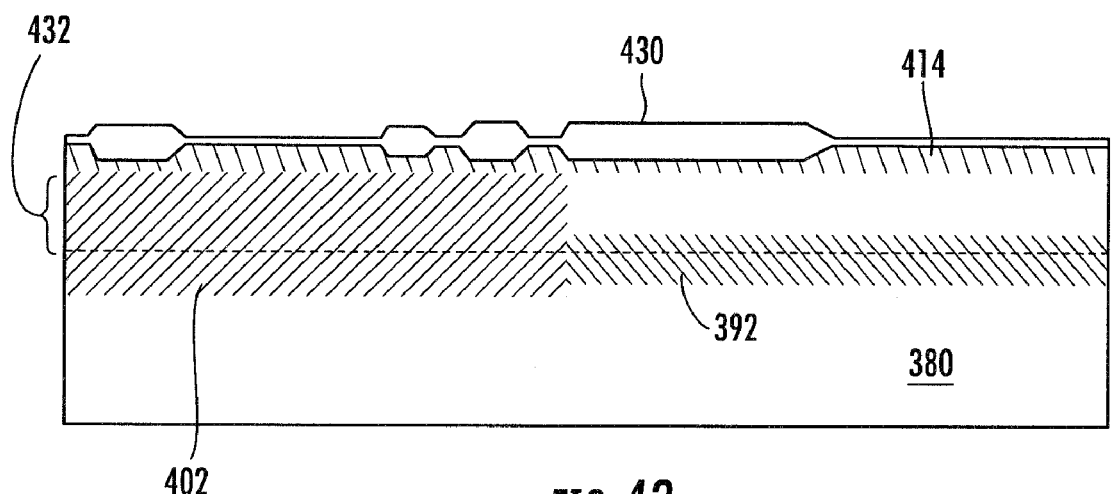

Next, an oxide strip is performed to remove the thermal oxide from the low-side substrate and the pad oxide from the high-side substrate. As depicted in FIG. 41, an N-type epitaxial layer 410 is grown to a thickness of between about 2,500 Å to about 6,000 Å, depending on the breakdown voltage requirements of the completed device. A pad oxide 412 is grown and a blanket N-drift implant 414 can be performed through the pad oxide into the epitaxial layer to result in the FIG. 42 structure. A nitride deposit, active area mask formation, nitride etch using the patterned active area mask to pattern the nitride, and resist strip can be performed to result in the FIG. 42 structure including patterned nitride 420. In this embodiment, the patterned nitride defines what will be the active area of the device.

Next, field oxide 430 is formed using a field oxidation then an up-diffusion anneal is performed to diffuse P-buried layer 402 into epitaxial layer 410 to result in diffused region 432. While the up-diffusion anneal diffuses both the P-type dopant (i.e. boron) 402 from the high-side P+ buried layer and the N-type dopant (phosphorous) 392 from the implanted low-side device, the faster-diffusing P-type dopant reaches a higher level within the N-epitaxial layer than does the N-type dopant (phosphorous).

Figure 44:
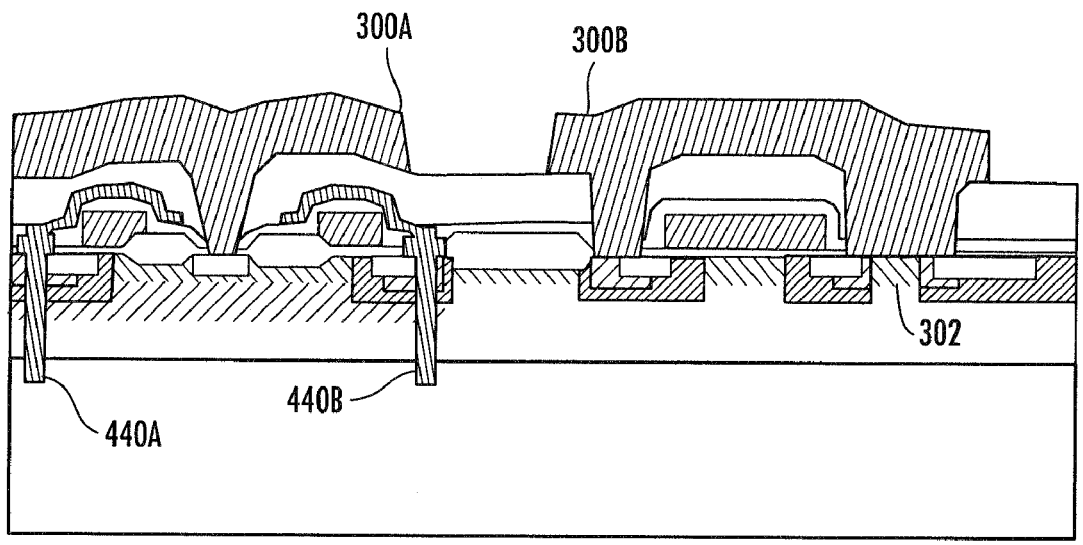

Subsequent processing can be performed to result in a structure similar to that depicted in FIG. 44. The structure of FIG. 44 includes a LDMOS high-side device having a design including with two trench-substrate-contact structures 440A, 440B.

Thus in this embodiment, the LDMOS structure is surrounded by a trench contact structure which can be used to reduce the resistance of the connection of the N+ source to the N+ drain of the vertical low-side device, as well as to completely isolate laterally the N+ drain diffusion of the high-side device FIG. 44 further depicts a planar VDMOS low-side device.

Exemplary Embodiment 7

In this embodiment, an example of which is depicted in FIGS. 45-50, a patterned P+ buried layer can be used to control up-diffusion of boron into an N-drift region of a high-side LDMOS device. This can enable a higher $BV_{DSS}$ for the high-side LDMOS device without increasing a thickness of an N-type epitaxial silicon layer.

Figure 45:
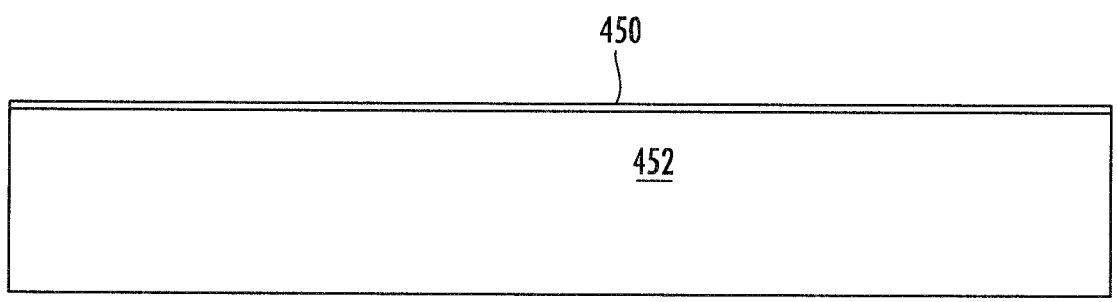
FIGS. 45-50 are cross sections depicting a seventh embodiment of a method and intervening structures of a voltage converter output structure.

As depicted in FIG. 45, a pad oxide 450 between about 150 Å and about 400 Å is formed over a semiconductor substrate 452 which has been heavily doped with arsenic.

Figure 46:
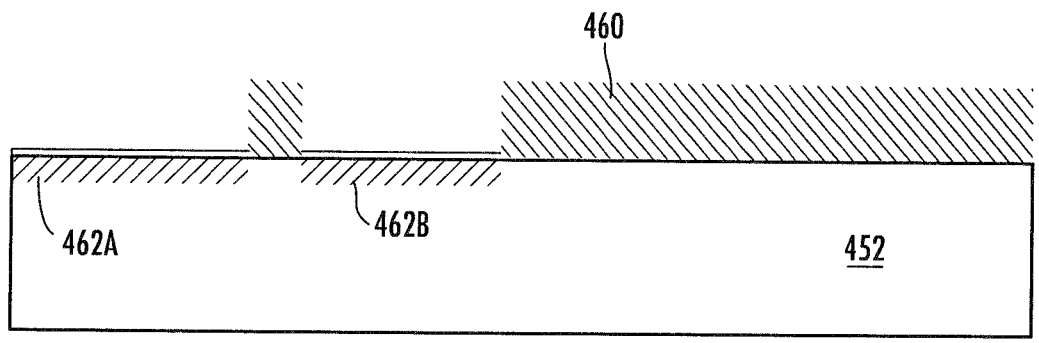
Figure 47:
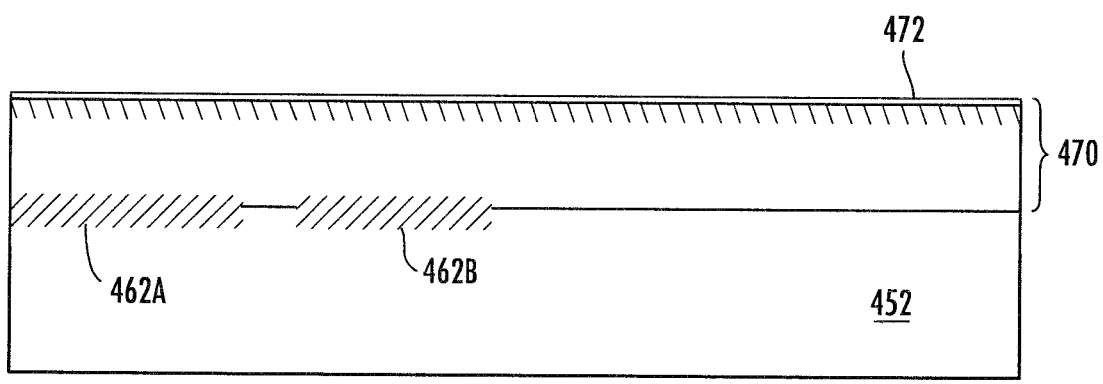

As depicted in FIG. 46, a patterned photoresist layer is formed over the semiconductor substrate 452 which will define implanted P+ regions 462A, 462B within the substrate 452 of the high-side device 56 to form a P+ buried layer. A shallow blanket P-type (boron) buried layer implant can be performed to result in the FIG. 46 structure. A boron implant to a dose of between about 1E13 atoms/cm$^2$ to about 1E15 atoms/cm$^2$ at an energy of between about 10 KeV to about 60 KeV with a 7° tilt would be sufficient.

Next, a the resist is stripped, and oxide etch process to remove the pad oxide is performed, followed by a wafer clean. An N-type epitaxial layer 470 is grown to between about 2,500 Å to about 6,000 Å, depending on breakdown voltage requirements of the completed device. A pad oxide 472 can be formed, followed by a blanket N-drift implant to result in the FIG. 47 structure.

Figure 48:
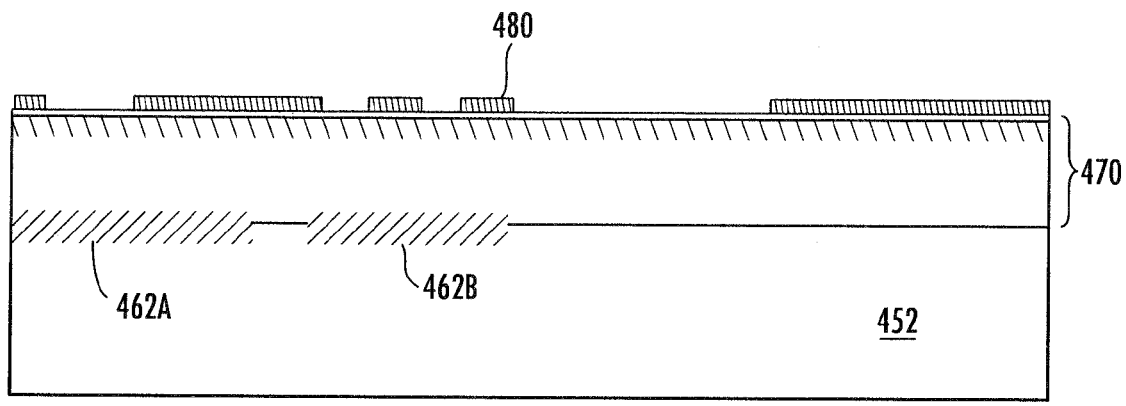
Figure 49:
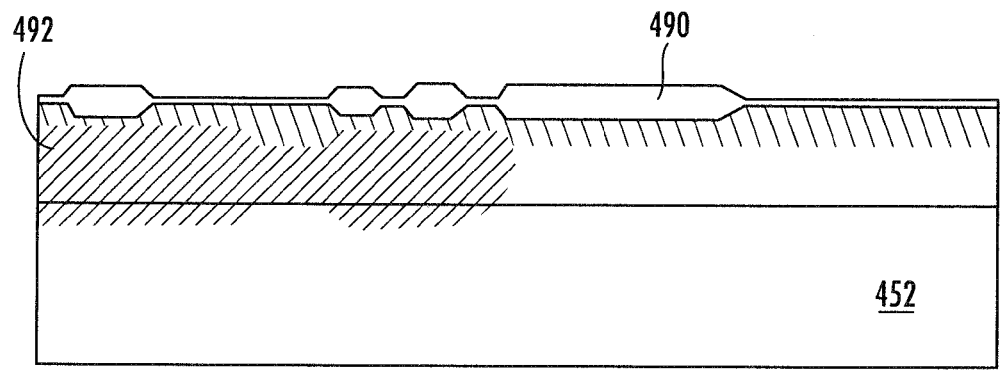

A nitride layer 480 is formed and patterned, for example using a patterned active area resist mask, to form the FIG. 48 structure. A field oxidation process can be performed to form field oxide 490 followed by an up-diffusion anneal and a nitride strip to result in the FIG. 49 structure including diffused P-buried layer 492. The up-diffusion anneal results in a diffused P+ region having a profile similar to that depicted in FIG. 49. The P+ dopant from the implanted buried layer is diffused up into the N-type epitaxial layer 470. A break in the diffusion in the region of the drain of the high-side device results from the masked implant at FIG. 46, and can result in an increased breakdown voltage of the completed LDMOS device.

Figure 50:
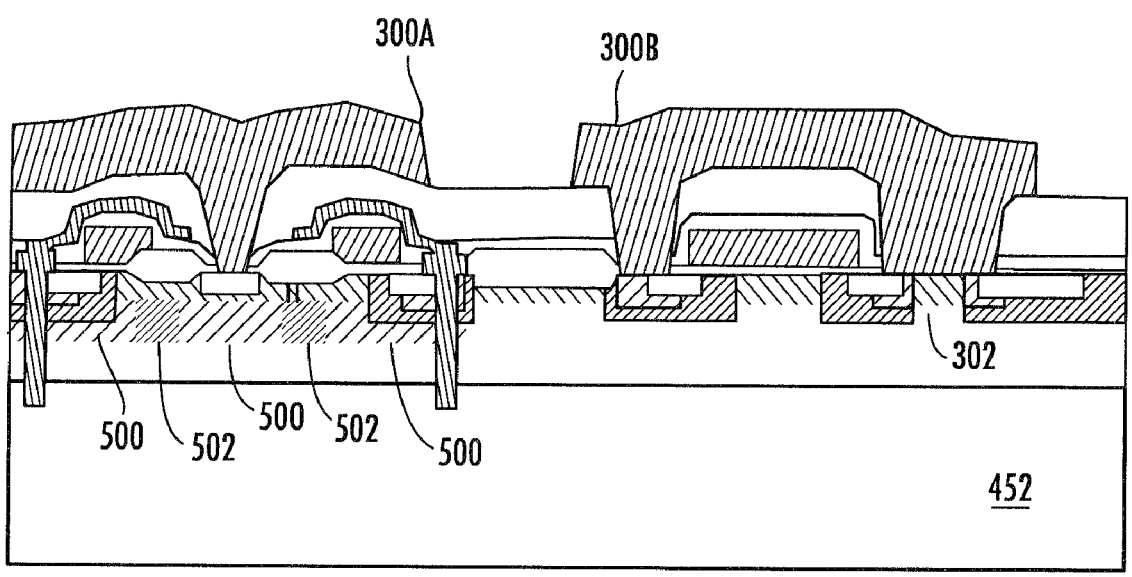

Subsequent processing, for example in accordance with prior embodiments, can be performed to result in a structure similar to that depicted in FIG. 50. This structure can, in certain uses, provide a P+ buried layer which can maximize breakdown for a given epitaxial structure resulting from the depth and profile of the P-buried layer. The pattern (profile) of the P+ buried layer can be designed to minimize the doping under the N-drift region to maximize the breakdown voltage.

This embodiment, like exemplary embodiment 6, includes a deep body region implanted directly in the substrate, before the N-epi is formed. In this embodiment, the deep-body region is patterned such that portions of it are masked to block from the high-side drain region to adjust the amount of boron which up-diffuses into the drain and accumulation region of the LDMOS structure. FIG. 50 depicts buried P+ regions 500 and lower doped P regions 502 where the buried P+ region is blocked by mask 460 of FIG. 46. One benefit of this approach is to maximize the breakdown voltage, for example by reducing the amount of deep P-body which up diffuses towards the N+ drain contact of the LDMOS, for example.

Thus various embodiments of the invention can provide a voltage conversion device which has reduced costs, which can result from the formation of a both power devices (a high-side device and a low-side device) on a single semiconductor die. This die can be co-packaged with a controller circuit on a separate die which controls operation of the voltage converter. The power devices, which can include a high-side planar lateral DMOS device and a low-side vertical DMOS device can have high efficiency (low power loss) and high frequency through reduction or elimination of parasitic inductance. The above-described methods enable use of high-side and low-side devices having advantages over previous voltage converters. Multiple products can be produced using a single controller simply by changing the die containing the output devices (i.e. the "power die"). Additionally, the described device can include reduced noise feedback to the controller, as well as reduced thermal feedback to the controller, over previous device designs.

In operation, the heavily doped substrate is the switched node. Thus the back side of the wafer is also the switched node (output) of the output stage, and can therefore be electrically coupled with devices requiring connection to the output stage. Assuming N-channel device are used for both the high-side and low-side power devices, no parasitic inductance between the switched node and the source of the high-side device may be possible, as well as to the drain of the low-side device.

Further, a single layer of metal is required to interconnect each of the drain of the high-side device, the source of the low-side device, and the gates of the two devices.

Additionally, a trench-substrate-contact structure connecting to the semiconductor substrate of the device can function as a high-side device gate shield structure to minimize parasitic capacitance and protect the gate from electrical influences from other device structures, for example from an overlying drain interconnect in addition to eliminating parasitic source inductance.

In various embodiments, the device structures are formed using a process which combines the TSC structure with a gate shield, which eliminates a number of processing steps.

Various processing approaches have been described to form the buried P-body region. For example, the region can be formed using an implant through the top surface of the final N-epi, or using an implant through the surface of a first thin N-epi which is formed prior the last N-epi or, for example, using an implant directly into the substrate to rely on a faster diffusion of boron compared to the substrate doping (arsenic for example) to form the deep-P-Body region in the N-epi grown on top of the substrate.

Various elements have contributed to the lack of consideration of using a planar LDMOS device and a vertical DMOS device on a single substrate. For example, their methods of formation has not been compatible, which leads to a lack of considering the two devices on a single substrate. The described embodiments provide a method for forming the two device with minimal processing steps. Further, high-performance monolithic power devices have been supplied using lateral structures formed on P-type substrates, which are not conventionally connected to high-current circuit electrodes. Thus vertical power devices, which are compact and low-cost, have not been considered. Finally, previous methods of forming the devices have been expensive, and thus the cost of forming both device types on a single die would be prohibitive. The methods of the present invention allow a cost-effective way to form the two device types on a single substrate.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g. 1 to 5. In certain cases, the numerical values as stated for the parameter can take on negative values. In this case, the example value of range stated as "less that 10" can assume negative values, e.g. −1, −2, −3, −10, −20, −30, etc.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including," "includes," "having," "has," "with," or variants thereof are used in either the detailed description and the claims, such terms are intended to be inclusive in a manner similar to the term "including." The term "at least one of" is used to mean one or more of the listed items can be selected. Further, in the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "conformal" describes a coating material in which angles of the underlying material are preserved by the conformal material. The term "about" indicates that the value listed may be somewhat altered, as long as the alteration does not result in nonconformance of the process or structure to the illustrated embodiment. Finally, "exemplary" indicates the description is used as an example, rather than implying that it is an ideal. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

The invention claimed is:

1. A method of forming a semiconductor voltage converter, comprising:
    forming a high-side transistor comprising a lateral diffusion metal oxide semiconductor (LDMOS) device on a substrate of a semiconductor die, wherein forming the high-side transistor includes patterning a gate conductor layer to form a gate of the LDMOS device;
    forming a low-side transistor comprising a vertical diffusion metal oxide semiconductor (VDMOS) device on the substrate of the semiconductor die such that the LDMOS device and the VDMOS device are electrically coupled to one another via the substrate, wherein forming the low-side transistor includes patterning said gate conductor layer to form a gate of the VDMOS device such that the gate of the LDMOS device and the gate of the VDMOS device are coplanar; and
    forming a single conductive structure which forms:
        a gate shield which is interposed between at least one conductive gate portion of the LDMOS device and a conductive structure which overlies the gate shield; and
        a trench conductor electrically coupled to a semiconductor substrate and to a source region of the LDMOS device.

2. The method of claim 1 wherein the semiconductor die is a first semiconductor die, and the method further comprises:
    forming a voltage converter controller circuit on a second semiconductor die different from the first semiconductor die; and
    electrically coupling an output circuit on the first semiconductor die comprising the LDMOS device and the VDMOS device to the controller circuit on the second semiconductor die.

3. The method of claim 2, further comprising co-packaging the first semiconductor die and the second semiconductor die into a single semiconductor device.

4. The method of claim 1 further comprising forming a second single conductive structure which forms:
    a drain interconnect which electrically couples a drain of the LDMOS device to voltage in ($V_{IN}$); and
    a source interconnect which electrically couples a source of the VDMOS device to ground.

5. The method of claim 1, further comprising:
    providing a semiconductor substrate having a back side;
    forming an output stage of the semiconductor voltage converter using a method which comprises the formation of the high-side transistor and the low-side transistor; and
    doping the semiconductor substrate to a dopant concentration of about 1E18 to 1E20 atoms/cm$^3$ such that, during operation of the semiconductor voltage converter, a back side of the semiconductor substrate is adapted to function as a switched node of the output stage.

6. The method of claim 1, further comprising:
    providing a semiconductor substrate comprising a semiconductor wafer;
    forming an epitaxial layer having a thickness over the semiconductor wafer;
    etching through the epitaxial layer to expose the semiconductor wafer and to form a trench within the epitaxial layer and within the semiconductor wafer; and
    forming the trench conductor within the trench.

7. The method of claim 1, wherein forming the high-side transistor and forming the low-side transistor further comprises forming the high-side transistor and forming the low-side transistor such that a source of the LDMOS is electrically coupled to a drain of the VDMOS via the substrate.

* * * * *